United States Patent [19]

Tsuchiaki

[11] Patent Number: 6,051,509
[45] Date of Patent: Apr. 18, 2000

[54] SEMICONDUCTOR INTEGRATED CIRCUIT MANUFACTURING METHOD AND DEVICE

[75] Inventor: Masakatsu Tsuchiaki, Tokyo, Japan

[73] Assignee: Kabushiki Kaisha Toshiba, Kawasaki, Japan

[21] Appl. No.: 09/047,593

[22] Filed: Mar. 25, 1998

[30] Foreign Application Priority Data

Mar. 25, 1997 [JP] Japan ..................................... 9-070998
Aug. 12, 1997 [JP] Japan ..................................... 9-217212

[51] Int. Cl.$^7$ ......................... H01L 21/31; H01L 21/469
[52] U.S. Cl. ...................... 438/758 R; 438/761; 438/763
[58] Field of Search ................................ 438/758, 763, 438/761

[56] References Cited

U.S. PATENT DOCUMENTS

| 5,756,391 | 5/1998 | Tsuchiaki . |
| 5,804,259 | 9/1998 | Robles . |
| 5,885,861 | 3/1999 | Gardner et al. . |
| 5,915,180 | 6/1999 | Hara et al. . |

OTHER PUBLICATIONS

J. Electrochem. Soc., vol. 143, No. 7, Jul. 1996, pp. 2378–2387, M. Tsuchiaki et al., "Experimental Study of the Impact of Carbon incorporated on silicon surface."

J. Electrochem. Soc., vol. 143, No. 9, Sep. 1996, pp. 2965–2992, M. Tsuchiaki et al., "A Detailed Study on the Effects Found in the above paper."

Primary Examiner—John F. Niebling
Assistant Examiner—Josetta Jones
Attorney, Agent, or Firm—Michael N. Meller; Eugene Lieberstein

[57] ABSTRACT

A manufacturing method produces a semiconductor IC device which can maintain a low power consumption for electronic circuits and form gate-isolation layers of different thicknesses without increasing the manufacturing cost. The semiconductor IC device has gate-isolation layers of different thicknesses on the same semiconductor substrate surface. To form such gate-isolation layers, a silicon dioxide layer is formed in first and second regions. The dopant-concentration is adjusted in silicon dioxide layer that is to have a thickness different from the above silicon dioxide layer thickness in the second region B. A carbon-containing semiconductor layer is selectively formed in either the first region or the second region. Therefore, there is no need for additional steps for forming silicon dioxide layers of different thicknesses in the first region and in the second region. In addition, a carbon-containing semiconductor layer is selectively formed on desired areas of the semiconductor substrate where thinner oxide layer is to be formed. The semiconductor substrate is oxidized successively to have oxide layers of different thickness on the surface of the substrate in one step.

13 Claims, 15 Drawing Sheets

SEMICONDUCTOR INTEGRATED CIRCUIT MANUFACTURING METHOD AND DEVICE

BACKGROUND OF THE INVENTION

1. Field of the Invention

The present invention relates to a semiconductor integrated circuit (IC) manufacturing method and device, and more particularly, a semiconductor IC device and manufacturing method for forming insulation layers by varying the carbon content therein.

2. Discussion of the Background

In a high-speed, high-functional conventional electronic circuit, highly independent and different functions, such as memory and logic, have been integrated on a large scale on different semiconductor substrates. Each of the semiconductor substrates is arranged on an insulated circuit board if required and is connected with metal interconnects. However, the lengths of metal interconnects formed on the insulated circuit board are much longer than the dimensions of an electronic element formed on the individual semiconductor substrates. Floating capacitance between surrounding insulating substances causes a large wiring delay. Therefore, such conventional technology is not suited for high-speed signal transmission between electronic elements on different semiconductor substrates. If the number of signal lines for a bus connecting different semiconductor substrates needs to be increased, the load capacitance of the bus increases; this increase in load capacitance degrades the noise resistance of the buffer circuit which drives the bus, causing erroneous operations to occur.

To resolve this problem and to provide a high-speed, and highly functional, electronic circuit, there is a growing demand for a monolithic IC which includes a plurality of electronic circuits formed on the same semiconductor substrate and having mutually fundamentally different functions. An example is an integrated system in a single-chip microcomputer and the like, comprising a central processor unit (CPU), which has a computing function, a memory, and a peripheral interface.

However, integrating a system on a single chip has some problems. For example, a metal-insulation-semiconductor field-effect transistor (MISFET), that constitutes a memory cell in a memory circuit, and a MISFET, that constitutes a logic circuit, have different threshold settings. Because of this difference in threshold settings, the different MISFETS are manufactured to have different gate-insulation layer thicknesses, substrate dopant concentrations, and the like during manufacturing steps. Differences in the functions of the MISFET used for the memory cell and the MISFET used for the logic circuit and the resulting different conditions are described in more detail below.

A memory cell, such as a dynamic random access memory (DRAM), comprises a metal-oxide-semiconductor field-effect transistor (MOSFET), which has a silicon dioxide ($SiO_2$) layer for the insulation layer, and also comprises capacitors, which are connected to the MOSFETs. The threshold voltage of a MOSFET cannot be set low because leakage current must be suppressed when the word line connected to the gate electrode of the MOSFET is turned off and electric charge stored in the capacitor must be retained. Especially when many uniform elements are integrated on the same substrate, the dopant concentration of the channel portion directly below a gate must be set high to suppress the short-channel effect which causes gate length dependency on threshold voltage. The gate length is the distance between source and drain electrodes.

In the memory cell, a voltage that is higher than the cell-array voltage (which is applied to the source electrode when the capacitor is charged) by at least the threshold voltage is applied to the word line. As described above, the threshold voltage for the MOSFET of the memory cell is also set high. Therefore, a large voltage is applied to the gate-oxide layer while the capacitor is being written. To prevent leakage current due to a high-voltage application or degradation of the gate-oxide layer, it is necessary that the electric field from the gate-oxide layer be kept small; that is, the gate-oxide layer must be made thick as described above. In an example of a conventional memory cell, the gate length is $0.35\mu m$, the cell-array voltage is 2.5V, the threshold voltage is 1.2V, and a voltage of 4.0V or larger is applied to the word line. To resist the electric field generated by the above, the gate-oxide layer must be approximately 10 nm thick.

In contrast to a memory cell, a MOSFET in logic circuit is not affected by leakage current, and it is desirable that the threshold voltage be set as low as possible to promote high-speed operation and sufficient driving capability.

Also, at certain levels, the short-channel effect does not affect the logic circuit performance, and it is desirable that the substrate dopant concentration in the channel portion be maintained as low as possible.

Further, the gate-oxide-layer thickness of the MOSFET in the logic circuit must be as thin as possible to obtain a sufficient driving capability. When the actual gate length is $0.35\mu m$ for the logic circuit, as is standard, the commonly used threshold voltage is approximately 0.7V and the oxide-layer thickness is approximately 7 nm.

As described, to form MOSFETs with different threshold voltages, that is, with different channel concentrations and different gate oxide-layer thicknesses, a series of plural steps are performed to obtain each of the MOSFETs, thus increasing the manufacturing cost, which is disadvantageous. Even when oxide layers of the same thickness are made, if a part of them is thinned by an etching solution, such as an HF solution, a new pattern must be formed to protect the portion which needs to maintain the original oxide-layer thickness.

A technique introduced to resolve these problems replaces the logic MOSFET with the memory cell MOSFET so that the gate-oxide layers can have a single thickness. The threshold voltage for the memory cell decreases. As a result, a leakage current (negative voltage) tends to flow when the word line is off. This problem is avoided by applying a negative voltage to the word line when it is turned off, if the memory cell MOSFET has an n-type channel (T. Tsuruda et al., *IEEE* 1996, Custom Integrated Circuit Conference, No. 13.2).

However, in order to apply a negative voltage to the word lines whenever they are off, a voltage source circuit with large driving power is required, and the power must be supplied to fulfill the demand even during stand-by time. Even when the data are not exchanged, when the work line is off, the low-voltage circuit nonetheless still consumes some power. This situation is contradictory to the purpose of reducing power consumption. For example, a low-power electronic circuit is essential for portable compact information terminals and the like, but it is difficult to provide the low-power circuit with this method.

In addition, the gate-oxide layer of a MOSFET for the memory cell is made as thin as that of the MOSFET for the logic circuit. Unlike conventional technology, this arrangement makes it impossible to boost the word line over cell-array voltage by more than the threshold voltage. As a result, when the electric charges that can be stored in the memory cell decrease, frequent refreshing is needed, and power consumption increases, which is problematic.

Also, in a field-effect transistor (FET) using a polysilicon layer as a gate electrode to which boron atoms are added, boron penetration phenomena, in which boron atoms in the gate electrode penetrate to a channel region, (i.e., semiconductor substrate surface or SOI surface via the gate-insulation layer) is a problem. Penetration of boron atoms to the channel region changes the channel-dopant concentration, which determines the threshold voltage and the like; this phenomena makes it difficult to obtain device properties as desired or causes un-desirable variation in properties among integrated devices.

In addition, to achieve a high-speed and highly functional, electronic circuit, in large-scale integration (LSI) specifically, there is a growing demand for miniaturization of FETs, which are a major constituent of LSI. However, miniaturization of the FETs has the difficulties described below.

For example, if the channel length is reduced, a short-channel effect is induced in which the threshold voltage decreases with the decrease of the channel length. The short-channel effect is caused by the distortion of the electric field at a region abutting the source or the drain-electrode to the channel portion. If a device has a different threshold voltage from the one intended in the design of the device, the device may not behave accurately as intended, degrading the function of the overall IC. Also, the threshold voltage is dependent on the dimensions of a gate electrode. A little variation of the gate electrode length can cause the device to lack the desired properties. This low tolerance is a drawback for semiconductor IC manufacturing in which many uniform devices are desired.

The short channel effect can be avoided by locating the position of the pn junction, which forms the junction between a source/drain electrode(s) and the semiconductor substrate, closer to the substrate surface. However, by shortening the depth of the pn junction, the resistivity of the source/drain electrode(s) which is constructed with the pn junctions, increases; this arrangement impedes the high-speed signal transmission through the device.

On the other hand, if the dopant concentration of a silicon substrate is increased along with the miniaturization of the device, the thickness of the depletion layer, extending from the pn junction surface, decreases and the leakage of the pn junction increases. Also, with a shallow pn junction, if the contact for electrical connection with the metallic wirings is formed on the surface in the source/drain electrodes, metallic substances diffuse downward to penetrate the pn junction and unfavorably induce leakage from the junctions.

In addition to lowering the source/drain electrode resistance, the surface of the dopant region may be combined with a metal (e.g., being combined with a silicon substrate is referred to as "to become silicide"). However, if the pn junction is shallow, metallic atoms diffuse through the dopant region to reach the pn junction surface, causing leakage from the junction. If a current leakage occurs through the junction, the device behaves incorrectly. A memory device, such as a DRAM, may lose the recorded data, and thereby lose the fundamental function as a memory device.

FIG. 15 is a cross-sectional view of a conventional elevated source drain type MOSFET formed using conventional technology. A technique proposed to resolve these problems additionally selectively grows silicon epitaxial layers 12a, 12b on the projected source/drain electrodes on the main surface of a silicon substrate 10. The surface of the silicon epitaxial layers 12a, 12b is moved above a surface region (region C in which a channel is formed) of the silicon substrate 10. Dopant regions 14a, 14b are formed below the substrate surface to pull down the pn junction. The source/drain electrodes 15a, 15b may provide sufficient thickness to prevent resistance increases, while the pn-junction position is close to the channel surface (*IEEE Electron Device Letters*, Vol. 11, No. 9, September 1990, pp. 365–367).

However, in this method, the location of the final pn junction of a source/drain electrode(s) must be adjusted precisely relative to the channel surface of the silicon substrate 10.

If the junction is too shallow from the desired location, the current driving force of this MOSFET is significantly decreased. If the junction is too deep from the desired location, the short-channel effect becomes a problem. However, the epitaxial layer growth by the epitaxial growth method is sensitive to the surface conditions on which selective epitaxial growth takes place. For example, the film thickness of the silicon layers 12a, 12b or film quality (presence/absence of defects) varies according to the surface roughness, shape, and crystal-lattice structure of the substrate 10 underneath. The presence of a natural oxide layer on the surface of the substrate 10 before epitaxial growth and the presence of defects introduced during the gate-electrode processing causes the film thickness and the film quality of the silicon layers 12a, 12b to vary from device to device.

As described, if the film thickness of the silicon layers 12a, 12b is not uniform, it becomes difficult to form the pn junction at the desired depth. Dopant, which forms the source/drain electrodes, is introduced from the surface of the silicon layers 12a, 12b to the surface of the substrate 10, and therefore, the junctions are formed at a predetermined distance from the surface of the silicon layers 12a, 12b. Thus, if the film thicknesses of the silicon layers are not uniform, it becomes difficult to locate the junction at a desired position. In addition, the presence of crystalline defects induces transient enhanced diffusion generation, Unexpected diffusion may result even if a given dopant thermal diffusion is provided. Therefore, it is virtually impossible to obtain uniform junction depths over a large number of devices.

To avoid these problems, before adding a silicon layer 12a, 12b onto a substrate 10, ions are implanted at a low acceleration energy on the surface region of silicon substrate 10. However, decrease of accelerating voltage of ion implantation decreases the ion-implantation rate. Because ions must be implanted at a high concentration to obtain an excellent conductivity, the implantation process takes an extremely long time which affects manufacturing productivity. Also, epitaxial growth following this procedure is dependent on the conductivity type of the source/drain electrode(s). When manufacturing a complementary MOSFET (CMOS circuit), films of different properties may be fabricated. Furthermore, the shallow junction fabricated above makes it impossible to perform high-temperature thermal treatment, and the like, following manufacturing process steps, in which the junction depth is changed.

Crystalline defects which are caused during the ion implantation or the formation of the gate-oxide layer can accelerate the dopant-diffusion process. Even in a low temperature processing which does not cause any problems in general, an unexpectedly deep junction can be created because it is difficult to control the junction depth. As a result, a stringent specification is required for thermal processes for the following purposes which limits the type of thermal processing available: for recovering crystalline defects; for electrical activation of implanted ions; and for formation and thermal processing of an interlayer insulator.

As described in detail herein, when forming electronic circuits having different functions, such as a memory function and a computing function, on the same semiconductor substrate (one-chip), it is difficult to fulfill the requirements needed for each of the MOSFETs which constitute circuits of different functions. For example, the channel portion of a MOSFET for a memory circuit has a high-dopant concentration and it must have a thick gate-oxide layer. On the other hand, the channel portion of a MOSFET for a logic circuit desirably has a low-dopant concentration and a thin gate-oxide layer. Therefore, in order to monolithically form circuits of different functions on the same substrate, a plurality of types of gate-oxide layers must be formed which increases the number of manufacturing steps, such as the addition of an oxidation step, and increases cost.

To resolve the problems, there is a technique in which a negative voltage is applied onto the word line which is turned off in order to use a MOSFET of a logic circuit as that of a memory circuit. However, this technique increases power consumption which is undesirable.

SUMMARY OF THE INVENTION

It is an objective of the present invention to resolve the above problems of conventional technology. It is an objective of the present invention to provide a semiconductor IC device which can maintain power consumption of the electronic circuit as low as possible and can form gate-insulation layers of different thicknesses on the same semiconductor substrate surface.

It is an objective of the present invention to provide a semiconductor IC device comprising gate-insulation layers of different film thicknesses.

It is an objective of the present invention to provide a semiconductor device in which the junction location of a source/drain electrode(s) is accurately at the depth of the channel region on the silicon substrate surface or deeper than the channel region.

It is an objective of the present invention to provide a method of manufacturing which is able to form a desired semiconductor device and does not greatly limit the choice of thermal processing and the like after formation of source/drain electrodes.

In a first aspect, the present invention provides a method for manufacturing a semiconductor IC device comprising the following steps: a first carbon-containing semiconductor layer is formed in a first region on a main surface of a semiconductor substrate; a second semiconductor layer containing less carbon content than the first carbon-containing semiconductor layer is formed on a second region of the main surface; a gate-insulation layer is formed in each of the first and second carbon-containing semiconductor layers and has a film thicknesses dependent on the carbon contents in the carbon-containing semiconductor layer; and semiconductor integrated circuits, such as a plurality of field-effect transistors having these gate-insulation layers may be formed.

In the present invention, the carbon-containing semiconductor layers may be formed by using a pattern which was used in adjusting the dopant concentration of the first region.

A second aspect of the present invention provides a manufacturing method in which carbon-containing semiconductor layers in a first region and a second region are formed on the main surface of a semiconductor substrate. The carbon content of the carbon-containing semiconductor layer in the second region is altered to form a semiconductor layer of less carbon content in the second region than the carbon-containing semiconductor layer in the first region. A plurality of gate-insulation layers having film thicknesses which are dependent on the carbon content of each of the carbon-containing semiconductor layer in the first region and the semiconductor layer in the second region are formed. A plurality of field-effect transistors is formed using these gate-insulation layers.

In this second aspect of the present invention, the step in which the carbon content or carbon ratio is modulated or altered may include using the same pattern used to adjust the dopant concentration in the second region. Also, in this second aspect of the present invention, the carbon content or carbon ratio may be modified by dipping the main surface of the semiconductor layer in the second element region into a hydrogen fluoride (HF) solution.

Also, through the use of the first and second aspects of the present invention, a monolithic circuit having different functions can be formed on the main surface of the semiconductor substrate by constructing a logic circuit with a field-effect transistor in the first element region and by constructing a memory circuit with a field-effect transistor in the second element region. By doing so, the memory circuit and computing function of the logic circuit can be formed on the same chip in a simple manufacturing step.

A third aspect of the present invention also provides a semiconductor IC device in which a first region and a second region are monolithically formed on a semiconductor substrate. In the first region a field-effect transistor having a carbon-containing gate-insulation layer is formed, and in the second region a field-effect transistor including a gate insulation layer having less carbon content than the gate-insulation layer in the first region is formed. Also, in this third aspect of the present invention, the field-effect transistor in the second region constitutes a memory circuit and the field-effect transistor in the first region constitutes a logic circuit.

According to the first and the second aspects of the present invention, there is no need for adding another patterning step for forming the carbon-containing semiconductor layer or for adjusting the carbon content following the dopant-concentration adjustment step. In other words, other than a step to add/adjust the carbon content of a semiconductor layer, no additional step is required. In particular, following the step of adjusting the dopant concentration in either region, insulation layers of different film thicknesses can be formed by selectively forming a carbon-containing semiconductor in a desired region using the same patterning mask such as the first or the second region.

Also, the third aspect of the present invention provides a semiconductor IC device which has gate-insulation layers of different film thicknesses on the same semiconductor substrate and is capable of providing operational properties according to each of the functions of different circuits.

Further, a fourth aspect of the present invention provides a semiconductor manufacturing system in which the following manufacturing method steps are performed: a first semiconductor layer containing carbon is formed on the main surface of a semiconductor substrate; a second semiconductor layer containing less carbon than that of the first semiconductor substrate is formed; and the first and the second semiconductor layers are formed into first and second insulation layers having film thicknesses which are dependent on the carbon content of each of the layers. In the fourth aspect of the present invention, the first and the second insulation layers are formed into a plurality of functional devices.

A fifth aspect of the present invention provides a semiconductor device comprising at least one device isolation region formed on the main surface of a semiconductor device, and also comprising a device region surrounded by one or more of such device isolation regions. The semiconductor device further comprises a gate electrode formed on the semiconductor substrate in the element region. A channel region formed on the surface region of the semiconductor substrate is below the gate electrode. A source/drain electrode(s) sandwiches a channel region. A carbon-containing insulation layer is formed below the source/drain regions.

According to the semiconductor device of the fifth aspect of the present invention, the carbon-containing insulation layer inserted between the source/drain electrodes and the semiconductor substrate prevents the dopants in the source/drain electrodes from downward diffusion. Even after thermal processing and the like, which induces movement of the dopants, the depth of the source/drain electrodes corresponds to the position of the carbon-containing insulation layer and can be maintained constant. Also, in the manufacturing step, the choice of thermal steps and the like can be broadened after the source/drain electrodes are formed.

In other words, according to the fifth aspect of the present invention, the depth of the source/drain electrodes is maintained accurately, with the presence of carbon-containing insulation layers, at approximately the same depth as the channel region or somewhat deeper from the desired position. This ability to control the depth of the source/drain electrodes prevents the short-channel effect due to the deviation in junction depths. The threshold voltage can be controlled highly accurately as well. In addition, with the presence of the carbon-containing insulation layer, the current leakage between the source/drain electrodes and the substrate can be suppressed. Also, according to the fifth aspect of the present invention, the semiconductor material of which the source/drain electrodes are constructed can be added to prevent increasing the current resistance of the source/drain electrodes.

A sixth aspect of the present invention provides a method of manufacturing a semiconductor device. Device isolation regions are formed on the main surface of a semiconductor substrate. A gate electrode is formed on the main surface of a device region and is surrounded by device isolation regions. A source/drain region having a bottom that is located lower than the channel region is formed. A carbon-containing insulation layer is formed at the bottom of the source/drain region, and a carbon-free isolation layer is formed on the vertical sides of the source/drain region. The carbon-free isolation layer is selectively removed on the vertical sides using the difference in etch rate between the carbon-containing insulation layer and the carbon-free insulation layer. A source/drain electrode(s) is formed at the source/drain region.

The sixth aspect of the present invention may comprise the formation of a source/drain electrode(s) comprising the following steps. The carbon-free side isolation layer is removed. A semiconductor layer is epitaxially grown on the exposed surface of the semiconductor substrate, which is created by removal of the carbon-free insulation layer.

By taking these steps, a uniform single crystal layer can be obtained easily. In addition, by adding a semiconductor material to grow the layer of the required thickness, the electrical resistance of the source/drain electrode(s) can be suppressed.

The formation of the source/drain electrode(s) includes the following steps. A semiconductor layer is formed on the main surface of a semiconductor substrate. A carbon-containing insulation layer is selectively formed on a surface of the semiconductor which is parallel to the main surface of a semiconductor substrate. An isolation layer is formed on a vertical surface of the semiconductor layer. The carbon-free isolation layer and a portion of the semiconductor layer adjacent to the carbon-free insulation layer are removed.

This method provides easy formation of the offset region between the gate electrode and the source/drain electrode(s). By using the etch-rate difference between the carbon-containing insulation layer and the carbon-free insulation layer, the offset can be shaped easily as well.

The carbon-containing insulation layer may be formed by exposing the semiconductor substrate to a carbon-containing plasma. Exposing the substrate to the carbon-containing plasma can follow the exposure to the plasma to provide patterns of gate electrodes. This sequence can simplify the manufacturing method, thus reducing the manufacturing cost. By using silicide for the surface of the entire source/drain electrode, the electrode can have a low resistivity.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

In various aspects, the present invention relates to a method of manufacturing a semiconductor IC device and to a semiconductor IC device which take advantage of the phenomena that insulation layers grow at different rates depending on the carbon content of semiconductor layers. Also in various aspects, the present invention relates to a method of manufacturing a semiconductor device and to a semiconductor IC device which take advantage of the phenomena that insulation layers are etched at different rates depending on the carbon content of semiconductor layers.

Figure 1A:
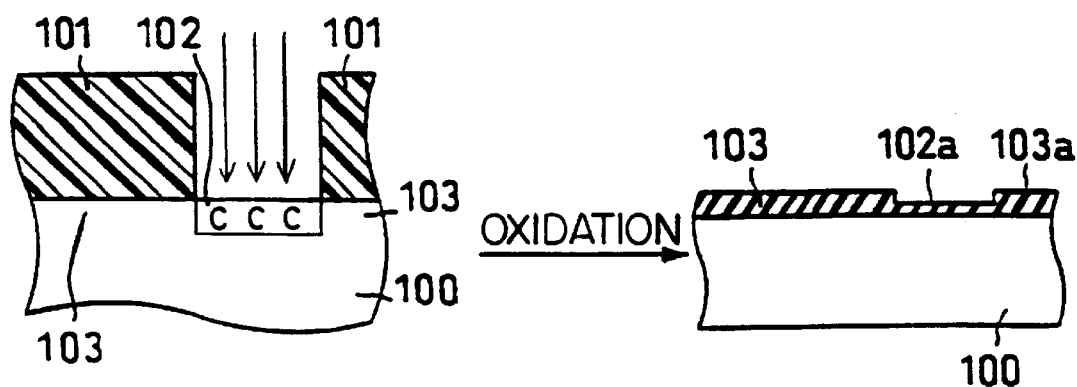
FIGS. 1 (*a*) and 1(*b*) are cross-sectional views showing the method of modulating the oxidation speed on a semiconductor substrate surface in a specific region using carbon atoms.
Figure 1B:
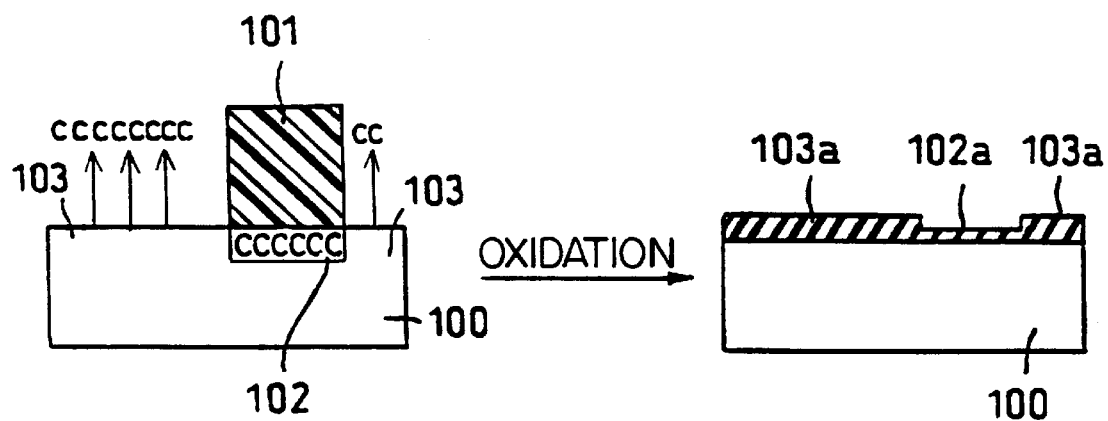

FIG. 1a and FIG. 1b are cross-sectional views of a semiconductor device illustrating the steps of forming insulation layers of different film thicknesses on the main surface of a semiconductor substrate. In FIG. 1a and FIG. 1b, a single insulation layer is used for clarity. Note that an oxidized layer is regarded as an example of an insulation layer herein. The steps are as follows. A resist pattern 101, having an opening in the region in which a thin oxide layer is formed, is first formed on a main surface of the semiconductor substrate (or semiconductor layer) 100. A thin carbon-containing semiconductor layer 102 is then formed selectively on the surface region of semiconductor substrate 100 which is exposed in the opening of the resist pattern 101. Thereafter the resist pattern 101 is peeled off, and the main surface of the semiconductor substrate 100 is then thermally oxidized in an annealing furnace in a predetermined environment and at a predetermined temperature. This process makes the oxidized layer 103a of semiconductor layer 103, which contains no carbon, thicker than an oxidized layer 102a of the carbon-containing semiconductor layer 102 because it was masked by the resist pattern 101.

Note that to form insulation layers of more than three different film thicknesses, it is possible to form three types of carbon-containing semiconductor layers in a desired region. In this case also, the steps of carbon introduction or carbon-content adjustment are performed by using the same pattern as that used in the adjustment of the dopant concentration in the channel region; the number of steps performed for regular photolithography can be performed and gate-insulation layers having more than three different film thicknesses can be obtained.

Also, as shown in FIG. 1b, to selectively form a thin carbon-containing semiconductor layer, a thin carbon-containing semiconductor layer 102 is first formed on the main surface of the semiconductor substrate 100. The region other than a thin oxide layer is formed, that is, the region 103 in which a thick oxide layer to be formed is selectively exposed to a hydrogen fluoride solution to remove carbon introduced to the region and to provide a lower carbon content for the semiconductor layer substrate 100 than the carbon-containing semiconductor layer 102. The resist pattern 101 is peeled off. When the surface of the semiconductor substrate 100 is oxidized, the oxidation rate in the region 103 from which carbon is removed becomes faster than the region 102 in which carbon remains. Therefore, oxidized layers 102a, 103a, having different film thicknesses, are formed in an oxidation step.

In addition, by performing the step in which a thick oxide layer is formed following the step in which a dopant is introduced for adjusting the dopant concentration in the region in which a thick silicon dioxide ($SiO_2$) layer should be formed, the above silicon dioxide layer thickness can be controlled without adding a photolithography step.

A first embodiment of the present invention is described with reference to cross-sectional diagrams, FIGS. 2(a) through 2(c), FIG. 3, FIG. 4, FIG. 5, and FIGS. 6(a) through 6(c), and to graphs, FIGS. 3 and 4. In FIGS. 2(a) through 2(c) and FIG. 5, the first region A and second region B are adjacent.

Figure 2A:
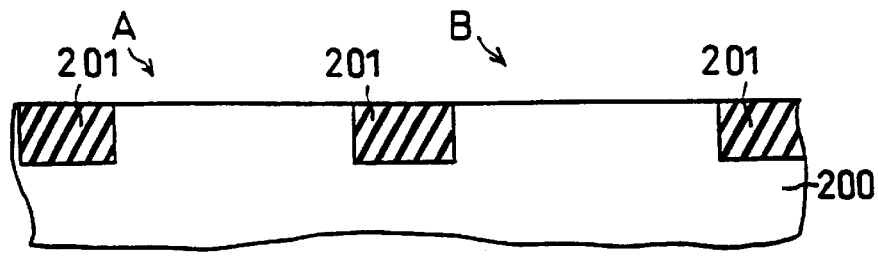
FIGS. 2(*a*), 2(*b*) and 2 (*c*) are cross-sectional views showing steps required for manufacturing a memory-logic monolithic semiconductor IC device in which gate silicon dioxide layers of different film thicknesses are formed on the same substrate according to a first embodiment of the present invention.
Figure 2B:
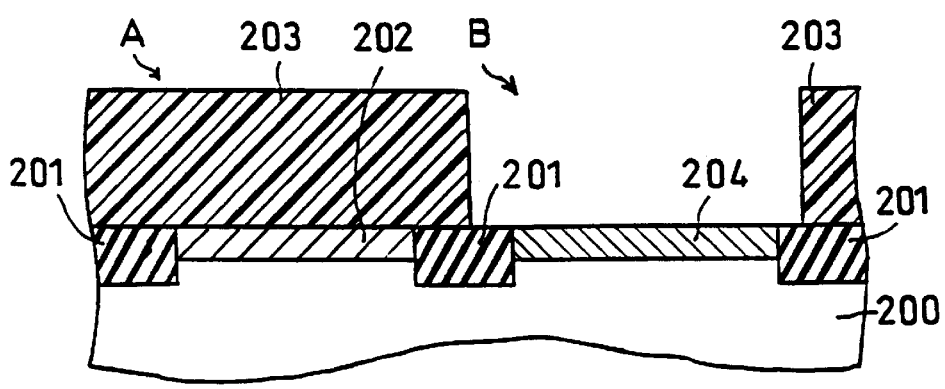

The drawings show the preferred embodiment in simplified form. For clarity, only one MOSFET is shown in FIGS. 2(a), 2(b), 2 (c) and 5. However, a plurality of first MOSFETs having a gate silicon dioxide layer of the same thickness that are isolated from each other by the isolation regions on the first element region A may be formed. Also, a plurality of second MOSFETs having a gate silicon dioxide layer of a different thickness from the thickness of the gate silicon dioxide layers of the first MOSFETs are isolated from each other by the isolation regions. The structure of the device formed in each of the regions is not limited to one type. Other device structures may be formed to fulfill a specific application.

Referring now to FIG. 2(a), a device isolation dielectric layer 201 (e.g., a silicon dioxide layer) is formed on a main surface of a silicon substrate 200 and electrically isolates the space between adjacent devices on the main surface of silicon substrate 200 by a well-known technique. Different device isolation layers 201 may be formed by other techniques, for example:

In a shallow-trench isolation (STI) technique, an isolation layer (e.g., a silicon dioxide layer) may be buried into a shallow trench formed on the main surface of the silicon substrate 200; and In a deep-trench isolation technique, an isolation layer may be buried in a deep trench formed on the main surface of substrate 200 to insulate adjacent devices.

After forming the device isolation region 201, a well region (not illustrated) is formed, for example, by an ion-implantation technique, to adjust the dopant concentration in the device isolation region.

Referring to FIG. 2(b), dopant ions are implanted on the main surface of the silicon substrate 200 to obtain a desired surface dopant concentration for the first region A. In this way, a channel-dopant region or a first dopant region 202 of the DRAM MOSFET is formed.

Then, as shown in FIG. 2(b), a resist mask 203 is formed to provide an open portion for the second region B and cover the first region A. The resist mask 203 allows readjustment of the dopant concentration of the second region B to obtain the channel-dopant concentration for the logic circuit MOSFET.

Dopant ions are selectively implanted onto the main surface of the second region B using the resist mask 203 as a protective layer. In this way, a channel-dopant region or a second dopant region 204 for the logic circuit MOSFET is formed.

Figure 2C:
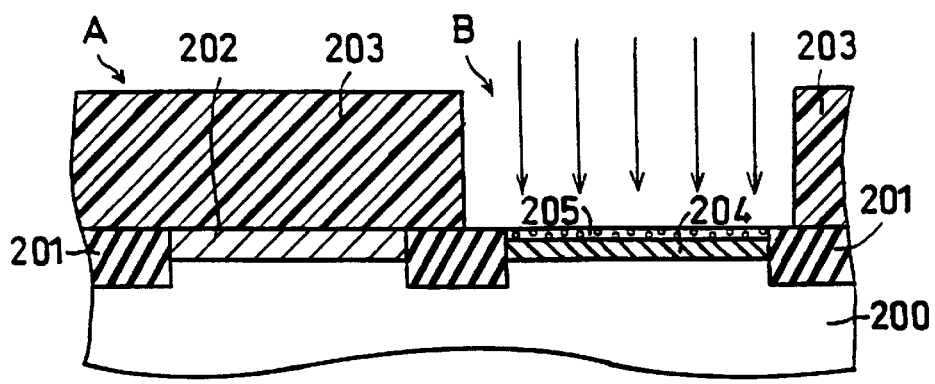

Refer now to FIG. 2(c). Then, leaving the resist mask 203 as it is shown in FIG. 2(c), the main surface of the silicon substrate 200 is exposed to a carbon-containing plasma. A conventional carbon supply source may be used to supply carbon to the plasma. For example, a carbon-containing plasma can be produced by using carbon-containing gas, such as $CF_4$, $CHF_3$, $CCl_4$ and $CH_4$, as a feed gas of the plasma.

Also, by using a carbon-containing substance for the resist mask 203 on the main surface of the substrate 200, the resist mask 203 absorbs carbon during the ion bombardment of a reactive ion etching (RIE) technique.

As a result, a thin, carbon-containing, silicon layer 205 is formed on the main surface of the second region B, as shown in FIG. 2(c). Particles from an RIE plasma usually have kinetic energy less than 1 keV, therefore incorporation of carbon is limited to several tens of angstroms from the main surface of the semiconductor substrate 200.

The carbon content of the thin, carbon-containing, silicon layer 205 can be controlled by a method effective within the range of prior art. For example, the amount of carbon introduced to the thin, carbon-containing, silicon layer 205 can be controlled by adjusting the following parameters: flow rate of carbon-containing gas supplied to the plasma; pressure; power; and process time (spent in plasma).

Carbon-ion implantation may be performed instead of the plasma exposure. In another method, a thin carbon layer can be formed on the main surface of the silicon substrate 200, carbon may be implanted on the substrate surface by ion implantation or plasma exposure.

It has been found that the oxidation rate of the carbon-containing silicon layer 205 decreases compared to that of a pure silicon layer. This phenomenon is described below with reference to experimental data.

Figure 3:
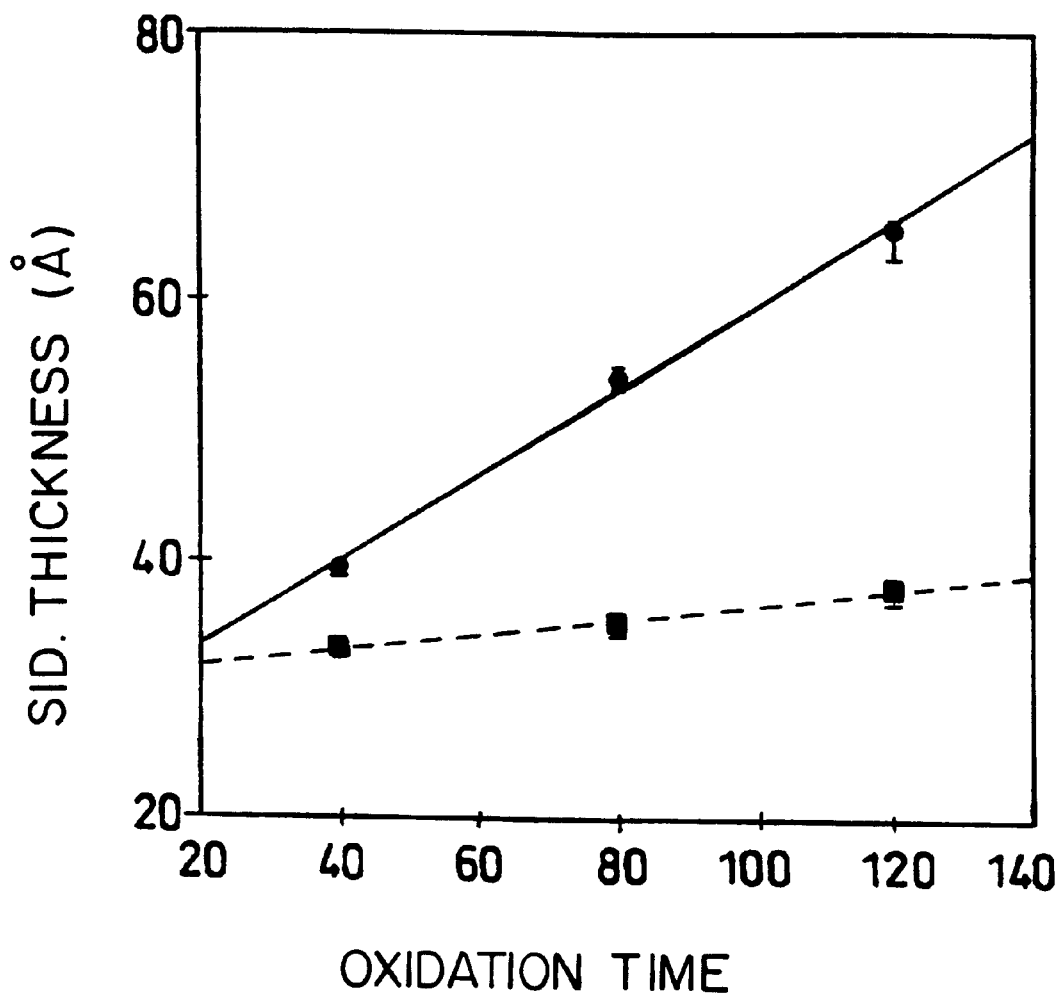
FIG. 3 is a graph showing the silicon dioxide layer thickness as a function of oxidation time comparing oxidation process of a carbon-containing silicon layer and a carbon-free silicon layer formed on the main surface of the same semiconductor substrate.

FIG. 3 is a graph showing the silicon dioxide layer thickness as a function of oxidation time, comparing oxidation process of the carbon-containing silicon layer (shown as a line 301) and the carbon-free silicon layer (shown as a line 302) formed on the main surface of the same semiconductor substrate. Oxidation was performed at a substrate temperature of 1000° C. under an 80% dry oxygen atmosphere. The carbon concentration in the carbon-containing silicon layer is 5 atom%.

Figure 4:
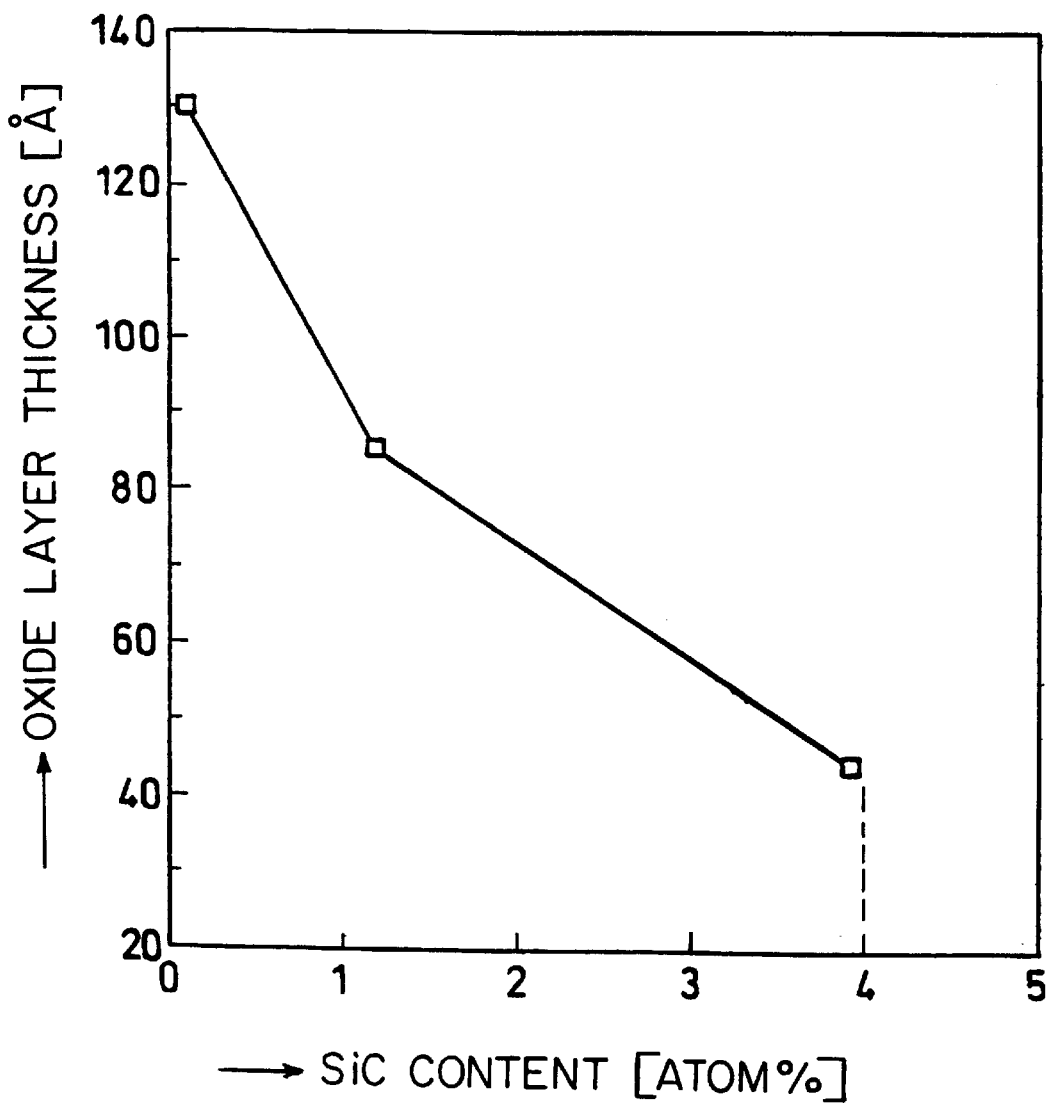
FIG. 4 is a graph showing an oxide layer thickness thermally grown on carbon-containing silicon-layer as a function of carbon concentration (atom %) having chemical bonding with silicon atoms.

FIG. 4 is a graph showing the oxide layer thickness grown on the carbon-containing silicon layer as a function of carbide concentration (atom %) of the silicon layer. The silicon dioxide layer was oxidized in a dry-oxygen environment at a substrate temperature of 1000° C. for 5 minutes. As shown in FIG. 4, an approximately 130Å thick silicon dioxide layer is formed on the pure silicon layer, while an approximately 40Å thick silicon dioxide layer is formed on an approximately 4 atom% carbon-containing silicon layer. Also, as is shown in FIG. 4, adjusting the introduced carbon concentration can change the final silicon dioxide film thickness.

Figure 5:
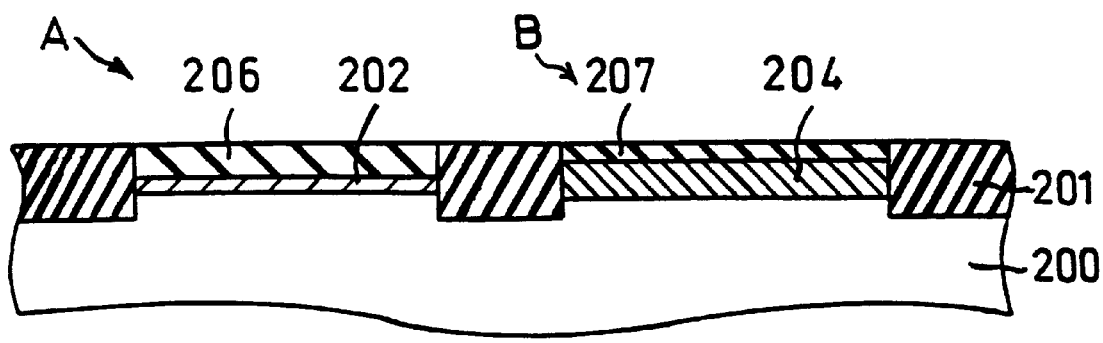
FIG. 5 is a cross-sectional view showing the embodiment of FIGS. 2(*a*), 2(*b*) and 2 (*c*) after removal of a resist mask of FIG. 2 (*c*) followed by oxidation in an oxidation environment for a predetermined time, in accordance with the process of the first embodiment of the present invention.

FIG. 5 is a cross-sectional view of the device structure formed after removal of the resist mask 203 of the structure of FIG. 2(c). The mask 203 may be removed, for example, by using an acid solution and the like followed by oxidation in an oxygen environment for a predetermined time. A thick silicon dioxide layer 206 is formed on the main surface of the first region A; a silicon dioxide layer 207 thinner than the silicon dioxide layer 206 is formed on the main surface of the second region B.

In the first embodiment of the present invention, carbon is introduced to the main surface of the second region B using the resist mask 203, which is used in the dopant concentration adjustment step. Therefore, silicon dioxide layers of different film thicknesses are obtained at the same time without adding a step to a single silicon dioxide layer formation. In this way, device regions having different gate silicon dioxide layers and channel concentrations can be obtained by a simple manufacturing technique, which reduces manufacturing cost compared to the conventional technique in which silicon dioxide layers of different thicknesses are produced in different steps.

The thin gate silicon dioxide layer 207 of the second region B may contain a larger quantity of carbon than the thick gate silicon dioxide layer 206 of the first region A.

Carbon atoms, which are present in the silicon dioxide layers, prevent boron atoms from penetrating the silicon dioxide layer. Therefore, if the present invention is applied to the gate silicon dioxide layer of a p-type MOSFET using a boron-doped polysilicon electrode, fluctuation of the dopant concentration in the channel region due to boron penetration can be suppressed. It is worthy to note that this structure makes a high-speed dual gate CMOS circuit process simpler.

After the formation of the gate silicon dioxide layer as described above, the following components may be formed by conventional technology.

In the first region A, the following components are formed; a MOSFET; an interdielectric layer; a capacitor; an inter-layer dielectric film; and contacts for each electric node via the inter-layer dielectric film layer.

In the second region B, the following components may be formed: a MOSFET; and an inter-layer dielectric film.

To complete a monolithic semiconductor IC device having memory and logic circuits, the following process steps are taken: an interconnect step to connect each of the device regions with other device regions; and a packaging step.

Figure 6A:
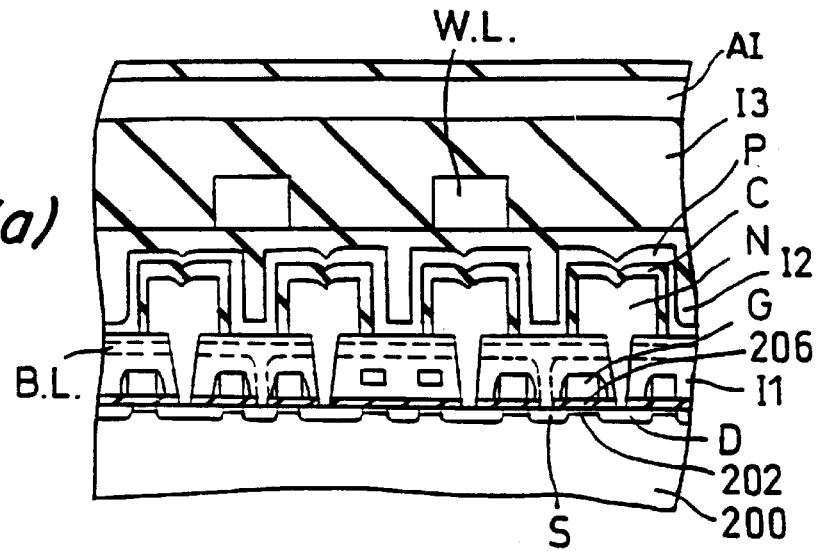
FIGS. 6(*a*), 6(*b*) and 6 (*c*) are cross-sectional views showing examples of device structures of the first and second device regions according to the present invention.

FIG. 6(a) shows a cross-sectional view of a semiconductor memory device having a DRAM stack capacitor structure, formed in the first region according to the present invention. In the first region on the main surface of the silicon substrate 200, the channel-dopant region 202 and the thick gate silicon dioxide layer 206 are formed as described above with reference to FIGS. 2(a), 2(b), 2 (c) and 3(a). A gate electrode G, comprising a polysilicon layer and the like, is formed on the gate silicon dioxide layer 206. The gate electrode G extends in the vertical direction to the view of the drawing (the word line [WL] direction). A plurality of memory cells form a cell array having the same cross-sectional structure as FIG. 6(a) (in the word line direction) on the cross-sections which are parallel to the cross-section of FIG. 6(a).

Figure 6B:
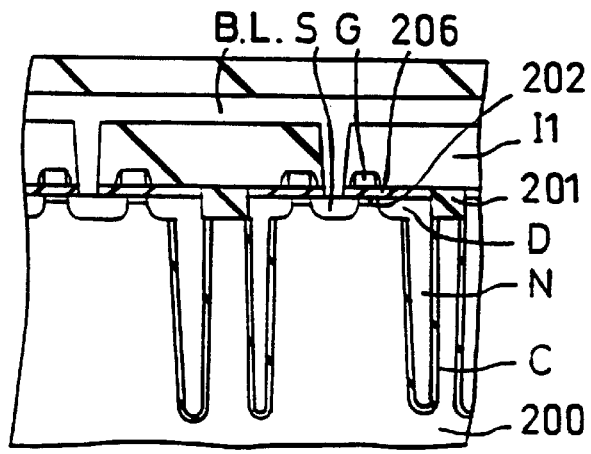
Figure 6C:
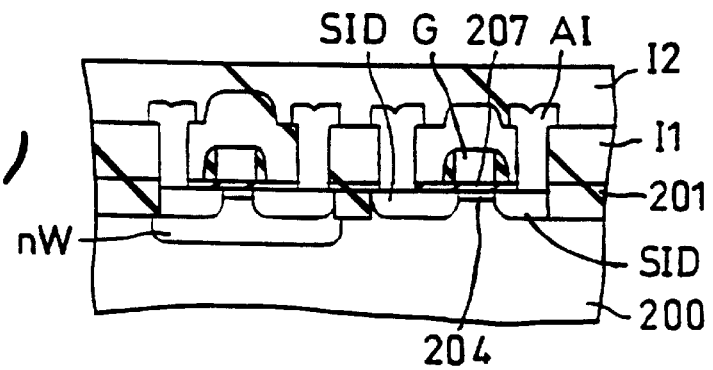

Using, for example, a conventional ion implantation technique, a source/drain diffusion layer S/D of source/drain electrodes (see FIG. 6(c)) is formed on the main surface of the silicon substrate 200 on both ends of the gate electrode G. A MOSFET, which constitutes a memory cell, comprises source/drain diffusion layer (S/D), the gate electrode G, and the gate silicon dioxide layer 206. On the S/D layers, an inter-layer dielectric layer I1 is formed. A capacitor C, a bit line (B.L.), and the like are laminated onto the MOSFET through the inter-layer dielectric layer I1. The capacitor C is formed of an insulator layer and is sandwiched by a pair of electrodes comprising a memory node (N) and a plate electrode (P). Memory data is read/written via a current route including a memory node (N), a drain-diffusion layer (D) channel activated by the controlling gate electrode, and source-diffusion layer S. The word-line (W.L.), an inter-layer dielectric layer I2, an inter-layer dielectric layer I3, an A1 interconnect, and the like are formed on the plate electrode (P).

In FIG. 6(a) and FIG. 6(b), for clarity, symbols are assigned for only one cell. In an IC memory device, a plurality of memory cells having the same structure are formed in the horizontal direction to the drawing (in the bit-line direction), and may form a cell array.

FIG. 6(b) is a cross-sectional structural view showing a DRAM having a trench capacitor, which is an example of a semiconductor memory device formed in the first region. Using the technique of the present invention, the device isolation region 201 (e.g., STI), the channel-dopant region 202, and the gate silicon dioxide layer 206 are formed by on the main surface of the silicon substrate 200. In the trench-capacitor structure, a trench is formed on the silicon substrate 200 before the formation of the gate silicon dioxide layer.

On both ends, sidewall layers are formed of a material such as $SiN_2$ which enables selectivity etching with respect to the silicon dioxide layer of the inter-layer dielectric layer I1. On the surface of the S/D, region, dopant is ion-implanted using the gate G as a mask. Then, the inner-isolation layer I1 is formed by the CVD method. Contact holes, are formed. In the hole, contact interconnects comprising Al and the like are formed.

FIG. 6(c), is a cross-sectional structural view of an n-well CMOSFET according to the present invention. The numbered MOSFET is an n-MOSFET; a p-MOSFET is disposed aside the MOSFET. Because a p-type substrate is used, the surface region of the p-MOSFET substrate is provided with an n-well (W). A double well CMOSFET is another structure of a CMOSFET, in which wells having different conductivity from the channel are formed on MOSFET regions of both types. FIG. 6 (c) shows a single CMOSFET. In the second region B (see FIG. 7(a)) which constitutes the logic circuit, it is common that a plurality of these CMOSFETs are formed thereon. To obtain an LDD for the source/drain diffusion layer, dopant is ion-implanted at small dosages at a low acceleration using the gate electrode G as a mask, which is followed by the ion-implantation step performed using the gate electrode G and sidewalls layers as masks.

Figure 7A:
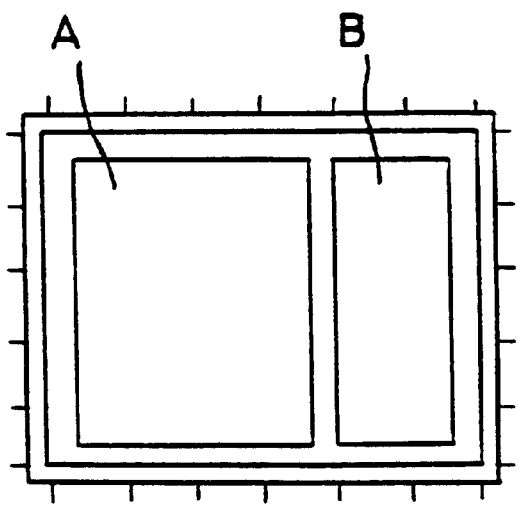
FIGS. 7(*a*) and 7(*b*) are plan views of semiconductor IC devices in which the first device region and the second device region are monolithically formed on a single semiconductor substrate according to the present invention.

FIG. 7(a) shows a plan view of a monolithic semiconductor IC device on which the first region A and the second region B are formed together. In one example, the device includes a DRAM in the first region A and a three-dimensional graphics circuit in the second region B. In another example, the device includes a DRAM which performs a specific function in the first region A and a processor in the second region B. In this example the gate silicon dioxide film thicknesses may be varied between each of the regions, and, also programming circuits and memory circuits such as the DRAM can be provided in each region. A plurality of terminals for external electrical connection are formed at the edge of a packaging substrate. The semiconductor IC device may be packaged on the packaging substrate by a conventional technique.

Figure 7B:
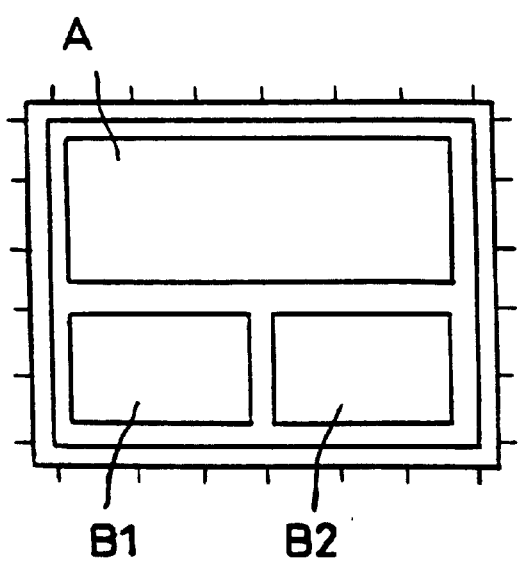

FIG. 7(b) is a plan view of a semiconductor IC device comprising the first region A and the second regions B1, B2 including a system controller or a graphics controller and the like which is connected to a memory in the first region A.

A second embodiment of the present invention incorporates the first, second, and fourth aspects of the present invention. The second embodiment includes a technique for forming silicon dioxide layers of different thicknesses in the first region and the second region on the same substrate with reference to cross-sectional diagrams showing process steps in FIGS. 8(a), 8(b), 8(c), FIG. 9, FIG. 10, and FIG. 11. The first region A and the second region B are illustrated adjacent for simplicity.

As described in the first embodiment, the following components may be formed by well-known techniques: MOSFETs; capacitors; contacts; interconnects; and packaging.

Figure 8A:
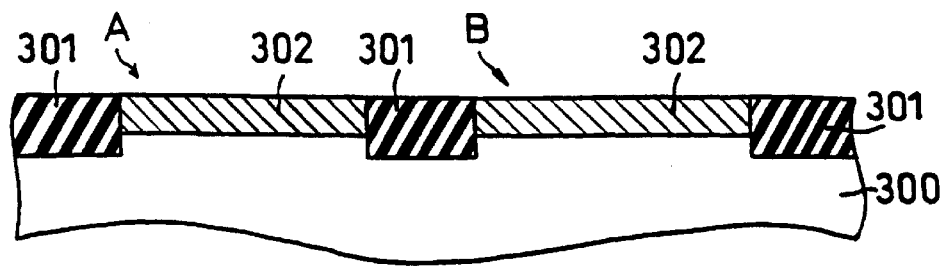
FIGS. 8(*a*), 8(*b*) and 8 (*c*) are cross-sectional views showing the manufacturing steps for forming gate silicon dioxide layers of different film thicknesses on the same semiconductor substrate for manufacturing a memory-logic monolithic semiconductor IC device according to a second embodiment of the present invention.
Figure 8B:
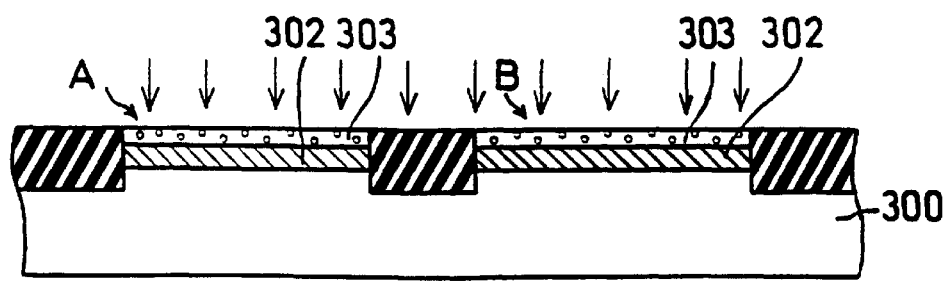

FIGS. 8(a), 8(b), and 8 (c) are cross-sectional views showing the manufacturing steps for forming gate silicon dioxide layers of different film thicknesses on the same semiconductor substrate for manufacturing a memory-logic monolithic semiconductor IC device according to a second embodiment of the present invention.

FIG. 8(a) shows the ion-implantation step in accordance with the present invention in which a conductive dopant is implanted onto the main surface of silicon substrate 300 including the first region A, which constitutes a DRAM MOSFET and the second element region B, which constitutes the logic circuit MOSFET. The silicon substrate 300 includes a plurality of device isolation regions 301 and a plurality of dopant regions 302. On the main surface of the second element region B on which the logic MOSFET is to be formed, the amount of ion implantation, the accelerated voltage, and the like are adjusted to obtain a desired dopant concentration thereon. At this stage, the dopant concentration of the main surface of the first element region A is equal to that of the second region B.

In the next step, as shown in FIG. 8(b), the semiconductor substrate 300 is exposed to carbon-containing plasma to form a thin carbon-containing silicon layer 303 on the main surface of the semiconductor substrate 300. The carbon-containing silicon layer 303 can be formed by the technique of the first embodiment of the present invention.

Figure 8C:
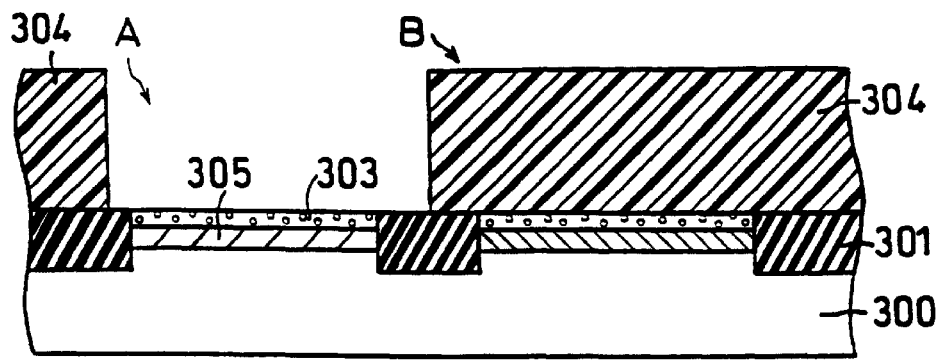

Then, as shown in FIG. 8(c), to readjust the dopant concentration of the first region A to the desired channel-dopant concentration for DRAM MOSFETs, a resist mask 304 having an opening in the first region A is formed. Dopant ions are ion-implanted in the first region A using the resist mask 304 as a protective layer to form a first dopant region 305.

Figure 9A:
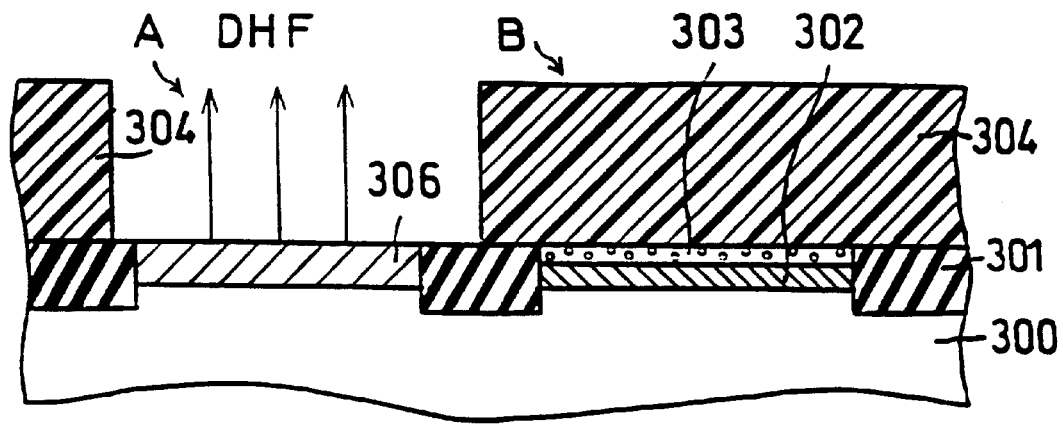
FIGS. 9(a) and 9(b) are cross-sectional views showing a portion of the process which continues from the process of FIGS. 8(a), 8(b) and 8(c), which is a manufacturing step related to the second embodiment of the present invention.

Next, as shown in FIG. 9(a), leaving resist mask 304 on the main surface of silicon substrate 300, the substrate 300 is dipped in a DHF solution diluted to 1/200 (pure water to hydrogen fluoride in volume). In this way, the thin carbon-containing silicon layer 303 previously formed on the main surface of the first region A can be selectively etched away with DHF to form a carbon-free layer 306.

It has been found that DHF cleaning of the main surface of the silicon layer 300, on which the carbon-containing silicon layer 303 is formed, reduces the carbon content of the carbon-containing silicon layer 303, and increases oxide rate of carbon-containing silicon layer 303; this phenomenon is described herein with reference to measurements.

Figure 10:
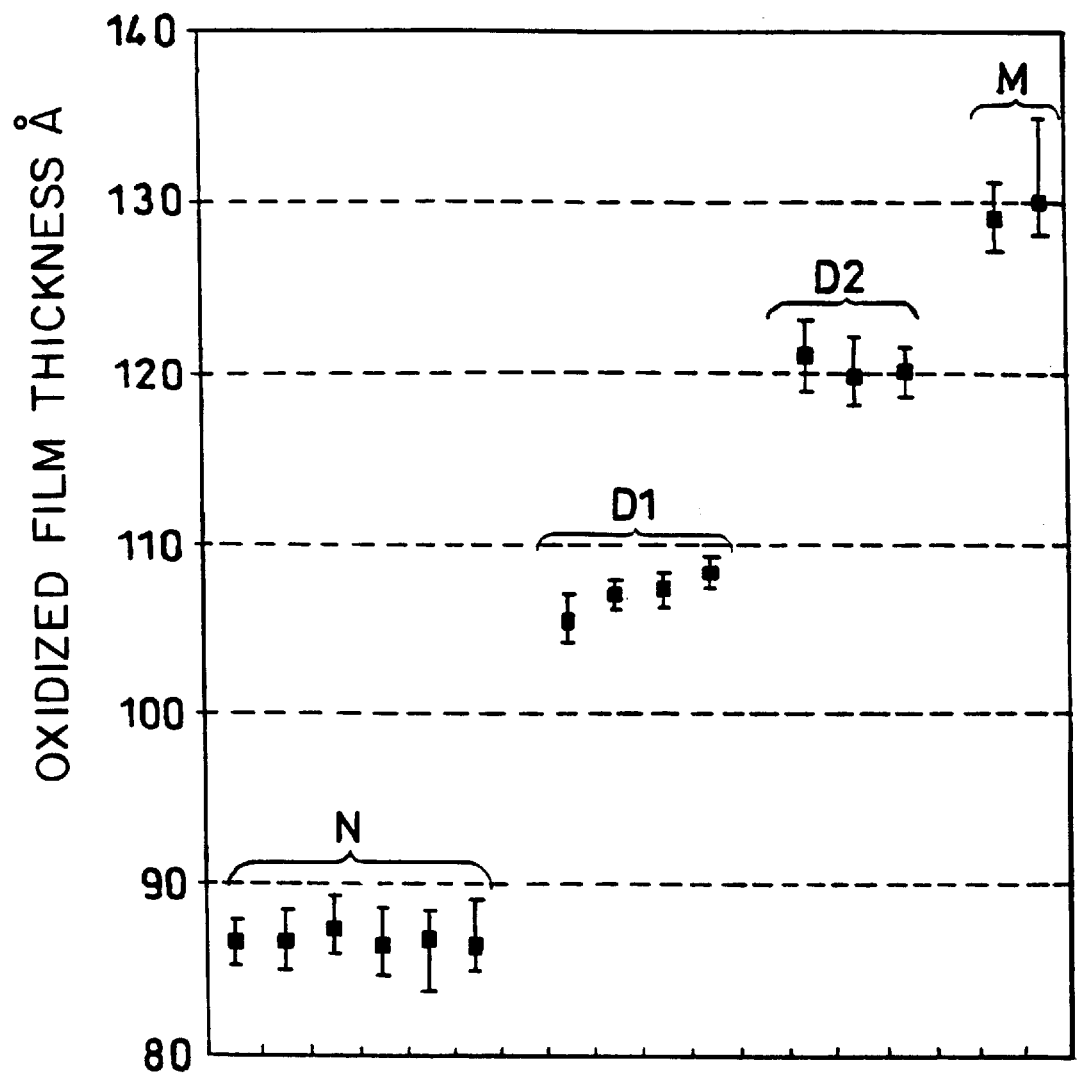
FIG. 10 is a diagram showing silicon dioxide film thicknesses thermally grown on a first sample having oxide grown on the carbon-containing silicon layer; a second sample having oxide grown on the carbon-containing silicon layer obtained by dipping the layer in the DHF solution prior to the oxidation for two different periods of time; and a third sample having oxide grown on pure silicon layer.

FIG. 10 is a diagram showing silicon dioxide film thickness for various samples having different carbon content and processed for different cleaning times. A carbon-containing silicon layer, N, on the main surface of each of the semiconductor substrates is individually dipped in the DHF solution as follows: D1 for 60 seconds; D2 for 600 seconds; N is never dipped; and M contains no carbon on its semiconductor substrate surface. The number of samples prepared for measurements are: N is 6; D1 is 4; D2 is 3; and M is 2.

The y-axis in FIG. 10 shows the silicon dioxide film thickness formed by oxidizing the above samples at a substrate temperature of 1000° C. for 5 minutes in dry ambient oxygen.

The carbon concentration of the sample N is 1.2 atom%. As shown in FIG. 10, the silicon dioxide film thickness formed on a carbon-containing silicon layer increases with DHF cleaning time, becoming closer to the silicon dioxide film thickness formed on silicon without carbon content. This results because DHF cleaning of the carbon-containing silicon layer removes carbon in the layer, thus accelerating the oxidation thereon.

Figure 9B:
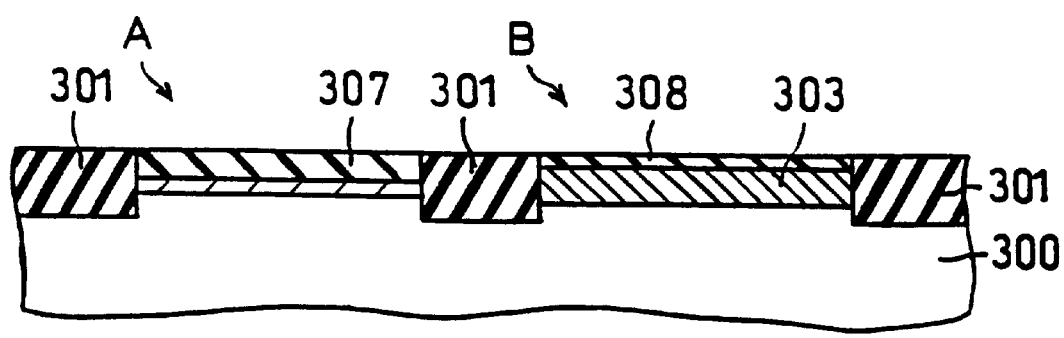

FIG. 9(b) shows a cross-sectional view of a device structure obtained after the removal of resist mask 304 using an acidic solution followed by the oxidation in a given oxide condition. A thick silicon dioxide layer 307 is formed on the surface of substrate 300 in the first region A. A thin silicon dioxide layer 308 is formed on the surface of substrate 300 in the second region B.

In the preferable mode of this embodiment, DHF cleaning is performed after the channel-dopant concentration adjustment step. It is a feature of the present invention that silicon dioxide layers of different thickness can be obtained in the first and the second regions without additional silicon dioxide layer formation steps of conventional technology. As a result, the regions having different gate silicon dioxide layers and channel concentrations can be formed in a simple manufacturing technique, which reduces the manufacturing cost to a large extent compared to the conventional technique in which silicon dioxide layers of different thicknesses are produced in separate steps.

In addition, as described above, using a gate-oxide layer containing carbon atoms for a logic portion prevents borons from escaping the gate electrode; and makes it easier to form a high-speed, dual-gate, CMOS circuit.

By the practice of the present invention, a monolithic semiconductor device may include memory and logic circuits. The memory circuit may be a DRAM including a MOSFET having a high-channel concentration and a thick gate silicon dioxide layer formed in the semiconductor region. The logic circuit may be a MOSFET having a low-channel concentration and a thin gate silicon dioxide layer formed on the semiconductor region.

In the above mode of the embodiment, a silicon dioxide layer is used for a gate-insulation layer for description purposes. However, the carbon introduction step of the present invention can be applied to an oxynitride layer and the like.

A silicon substrate is used as an example in the above preferable mode of the embodiment of the present invention. However, any substrate using alternative semiconductor material can be used. The semiconductor substrate can be formed of a bulk substrate formed of a single semiconductor material or a semiconductor on an insulator (SOI) substrate in which semiconductor (SOI) layers are formed on a semiconductor substrate via an insulation layer. When using an SOI substrate, the field-effect transistors in the first region and the second region are formed in the SOI layer.

Further, the circuit, comprising the first and the second regions is not limited to the memory or logic circuits described above. The present invention also can be applied to other functional circuits in which an insulation layer thickness of the circuit may be adjusted according to the functions of each circuit.

A third preferred embodiment of the present invention is described and is based on the fourth through the sixth aspects of the present invention. The third embodiment relates to a salicide-type elevated source/drain MOSFET having a carbon-containing insulation layer at the bottom of the source/drain electrode(s).

Figure 11A:
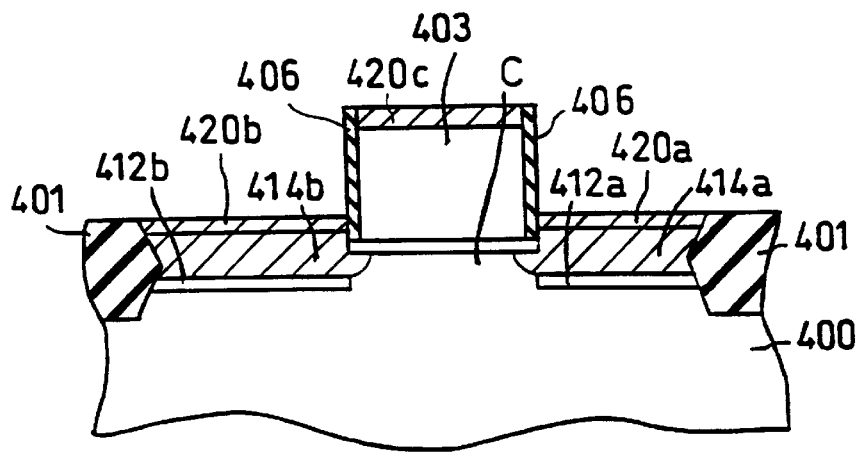
FIGS. 11 (a), 11b and 11 (c) are cross-sectional views showing a method of manufacturing salicide-type elevated source drain MOSFETs having a carbon-containing silicon dioxide layer below the source/drain electrodes according to a third embodiment of the present invention.

FIG. 11(a) is a cross-sectional view illustrating a MOSFET according to a third embodiment of the present invention.

A gate electrode 403 is formed in a device region surrounded by isolation regions 401 on the surface of a semiconductor substrate 400; a channel region C is formed directly below the gate electrode 403.

Carbon-containing insulation layers 412a, 412b are formed at both ends of the channel region C and are deeper than the channel region C. Source/drain electrodes 414a, 414b are formed thereon.

The bottoms of the source/drain electrodes 414a, 414b are insulated by the carbon-containing insulation layers 412a, 412b from the opposite conductivity type well region (not illustrated) and the semiconductor substrate 400. Also, surfaces of the source/drain electrodes 414a, 414b extend above the semiconductor substrate surface. The gate electrode 403 is insulated from the source/drain electrodes 414a, 414b by sidewall-insulation layer 406. Self-align metal silicide layers 420a, 420b, 420c are disposed on the respective silicon layers 414a, 414b and the gate layer 403.

These FETs have the following properties.

First, the carbon-containing insulation layers 412a, 412b suppress the junction current leakage between the source/drain electrodes 414a, 414b and the semiconductor substrate 400. Even if any crystalline defects exist in the source/drain electrodes 414a, 414b, the current leakage due to the defects can be suppressed.

Also, even if the film thicknesses or the film qualities of the S/D semiconductor layer are not uniform, the junction location is limited to a predetermined depth by the carbon-containing insulation layers 412a, 412b; this structure suppresses fluctuations of threshold voltages due to the fluctuation of the junction depths.

The structure also suppresses the current leakage along the device isolation region 401, through the junction between the source/drain electrodes 414a, 414b, and the semiconductor substrate 400.

In addition, in this embodiment of the present invention, the semiconductor layer comprising the source/drain electrodes 414a, 414b can be formed in any thickness to realize a desired electric resistance.

Further, the carbon-containing insulation layers 412a, 412b prevent the diffusion of metallic substances into the semiconductor substrate 400 and suppress current leakage due to the metallic substances. As a result, the surface of the source/drain electrodes 414*a*, 414*b* or the overall electrodes can be formed of a complete metal-semiconductor compound. In the same manner, if the contacts are formed to obtain an electrical connection to the source/drain electrodes 414*a*, 414*b*, downward diffusion of metal atoms stops at the carbon-containing insulation layer 412*a*, 412*b* to thereby prevent leakage current caused by the metallic substances.

When using a shallow-trench isolation technique in which a subject to be insulated is buried in a shallow trench, the current leaks through the critical surfaces provided by the isolation, source/drain electrodes, and the substrate is prevented by the carbon-containing insulation layer.

To reduce electric resistance, it is desirable that the surface or the entire body of a source/drain electrode(s) be formed of a metal-semiconductor material compound. Which such a device structure, the carbon-containing insulation layer prevents diffusing of metallic metal into the substrate. The current leakage due to the metal diffusion can be suppressed, thus effectively controlling the resistivity of a source/drain electrode(s). Also, the entire electrode can be made of a complete compound layer. This portion may be completely replaced with a silicide which has a low resistivity. In the same manner, if a contact of a metal wiring is formed to obtain an electrical contact at the top surface of the source/drain electrode(s), there is no penetration of the metallic material into the junction due to downward diffusion of the metallic material.

FIGS. 11(*a*), 11(*b*), 11(*c*), 12(*a*), 12(*b*) and 12 (*c*) are cross-sectional views of a field-effect transistor formed according to the third embodiment of the present invention.

First, as shown in FIG. 11 (*b*), the device isolation region 401 is formed by the well-known LOCOS technique, the deep-trench isolation technique, or a shallow-trench isolation technique (the STI technique mentioned above) which buries the insulation in a trench formed on a silicon substrate. As shown in FIG. 11(*b*), after a gate insulation 402 formation, a conductive layer and an insulation layer, such as a silicon nitride layer are deposited by the LPCVD method and the like, and the gate electrode 403 and an insulation layer 404 on its surface are formed by the anisotropic etching technique (e.g., Lithography, PEP, RIE). Also as shown in FIG. 11(*b*), an insulation material or an isolation layer 405, which constitutes the gate sidewall insulation layer, for example, a silicon nitride layer, is formed by the CVD method.

As shown in FIG. 11(*c*), horizontal portions of the insulation material 405 are selectively removed by anisotropic etching, such as RIE. The gate sidewall insulation layer 406 is formed by leaving vertical portions on both sides of the gate electrode. The anisotropic etching continues until the surface of the silicon substrate 400 (see FIG. 11(*b*)) is etched to a desired depth to provide a concave region (projected source/drain region) 407 with respect to the channel region C. When the surface of the silicon substrate 400 reaches the desired depth, carbon is provided to a plasma gas for RIE. The carbon-containing plasma can be produced by any methods which are effective within the range of conventional technology. A conventional source, which can supply carbon to the plasma gas, can be used. For example, the carbon-containing plasma can be produced by using carbon-containing gas, such as: $CF_4$, $CHF_3$, $CCL_4$, and $CH_4$, as the feed gas to the plasma.

When a carbon-containing material, such as a photo resist mask is formed in advance on the surface of the semiconductor substrate 400, carbon can be supplied through ion bombardment on the photoresist mask during reactive-ion etching (RIE). The RIE conditions (e.g., gas pressure) during over-etching is not required to be equal to that during etching of the insulation material 405 (see FIG. 11 (*b*)). The completion of the removal of the insulation material (see FIG. 11 (*c*) may be detected to change conditions in a plasma reaction chamber sequentially. The sequential change in conditions can be performed as a part of the single step in which the gate sidewalls are processed. In general, plasma has a positive potential, with respect to the surrounding materials, to maintain its plasma state. As a result, the plasma generates an electric field in the direction so that particles which are positively charged impinge vertically the surrounding material. Therefore, positively charged carbon particles in the plasma collide vertically with the gate electrode 403 and the silicon substrate 400.

Carbon particles are, implanted only on the horizontal surface of downward projected source/drain region 408*a*, 408*b*; they are not implanted on the vertical surfaces 409*a*, 409*b*. In this way, carbon-containing silicon layer 410*a*, 410*b* are formed on the surface horizontal to the substrate surface. The acceleration energy of normal RIE condition is equal to or less than 1KeV; with this low energy, the thickness of the resultant carbon-containing silicon layer 410*a*, 410*b* does not exceed several tens of angstroms. It is desirable that the carbon concentration of carbon-containing silicon layers 410*a*, 410*b* is equal to or larger than 1 atom%. Otherwise, a carbon-containing silicon layer could be formed. First, a thin carbon layer can be formed on the silicon substrate 400 after etching sidewalls. Then ion bombardment on the thin carbon layer makes carbon atoms recoil into the substrate to form silicon layers 410*a*, 410*b*.

Figure 11B:
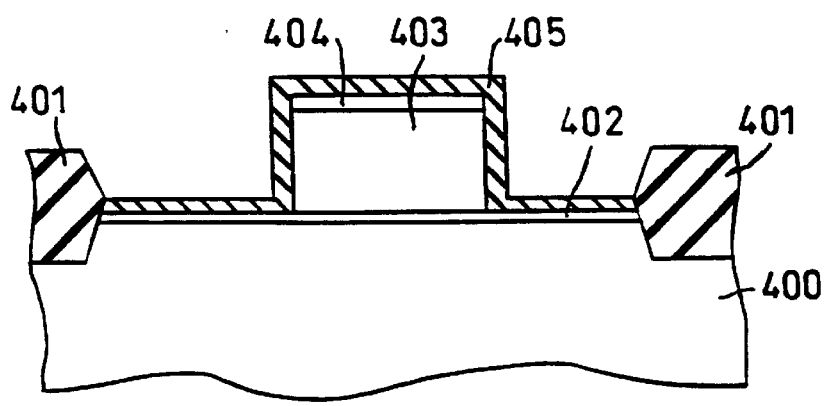
Figure 11C:
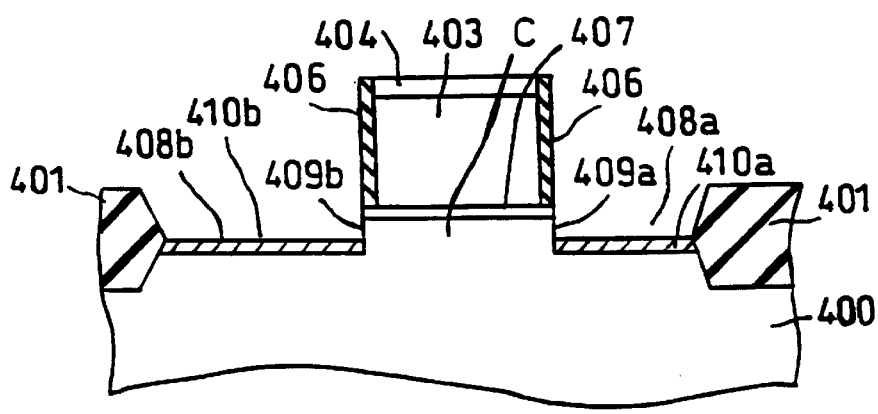
Figure 12A:
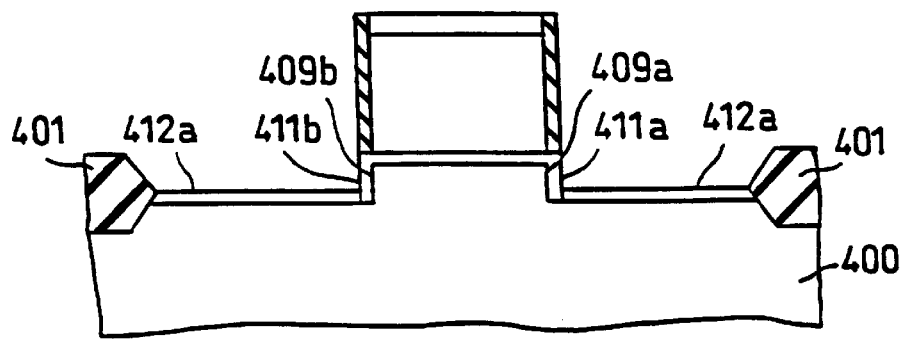
FIGS. 12(a), 12(b) and 12(c) are cross-sectional views of device structures of the third embodiment of the present invention.
Figure 12B:
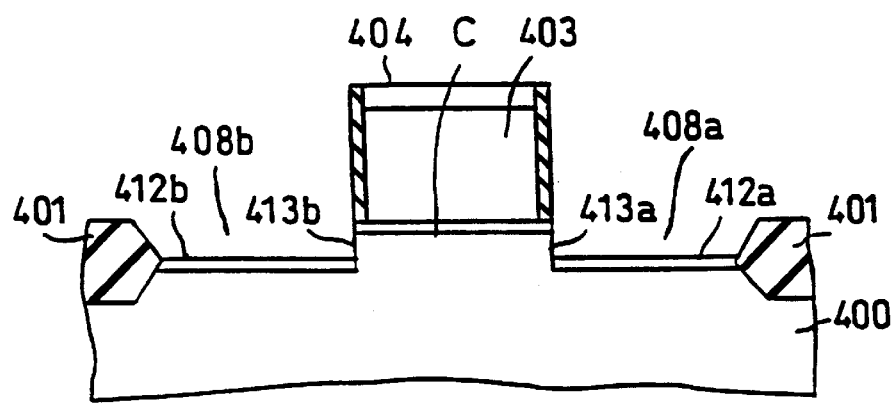
Figure 12C:
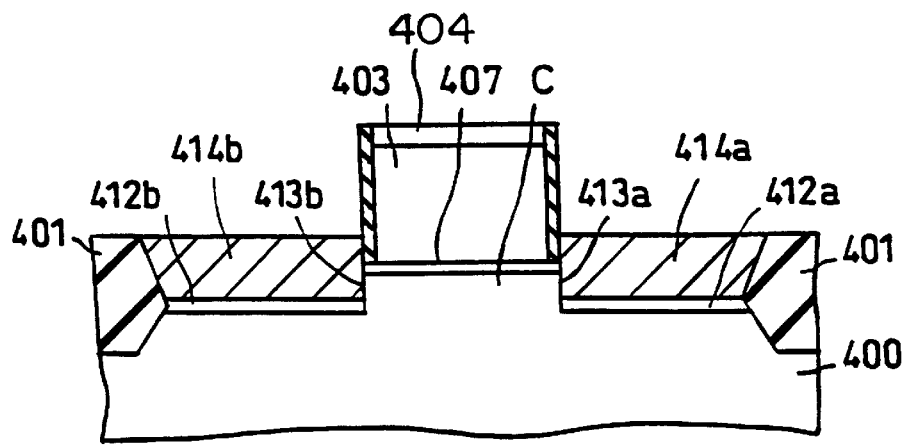

After thermal oxidation at, for example, 1000° C., as shown in FIG. 12(*a*), carbon-free silicon dioxide layers 411*a*, 411*b* with no carbon-particle content are formed approximately 50Å thick on vertical surfaces 409*a*, 409*b* by a thermal oxidation. And carbon-containing silicon layers 410*a*, 410*b* (see FIG. 11(*c*)) are oxidized into carbon-containing silicon dioxide layers 412*a*, 412*b* (see FIG. 12(*a*)). It has been found that there is a big difference in HF etch rate between the carbon-containing silicon dioxide layers 412*a*, 412*b* and the silicon dioxide layers 411*a*, 411*b* with no carbon content.

Figure 13:
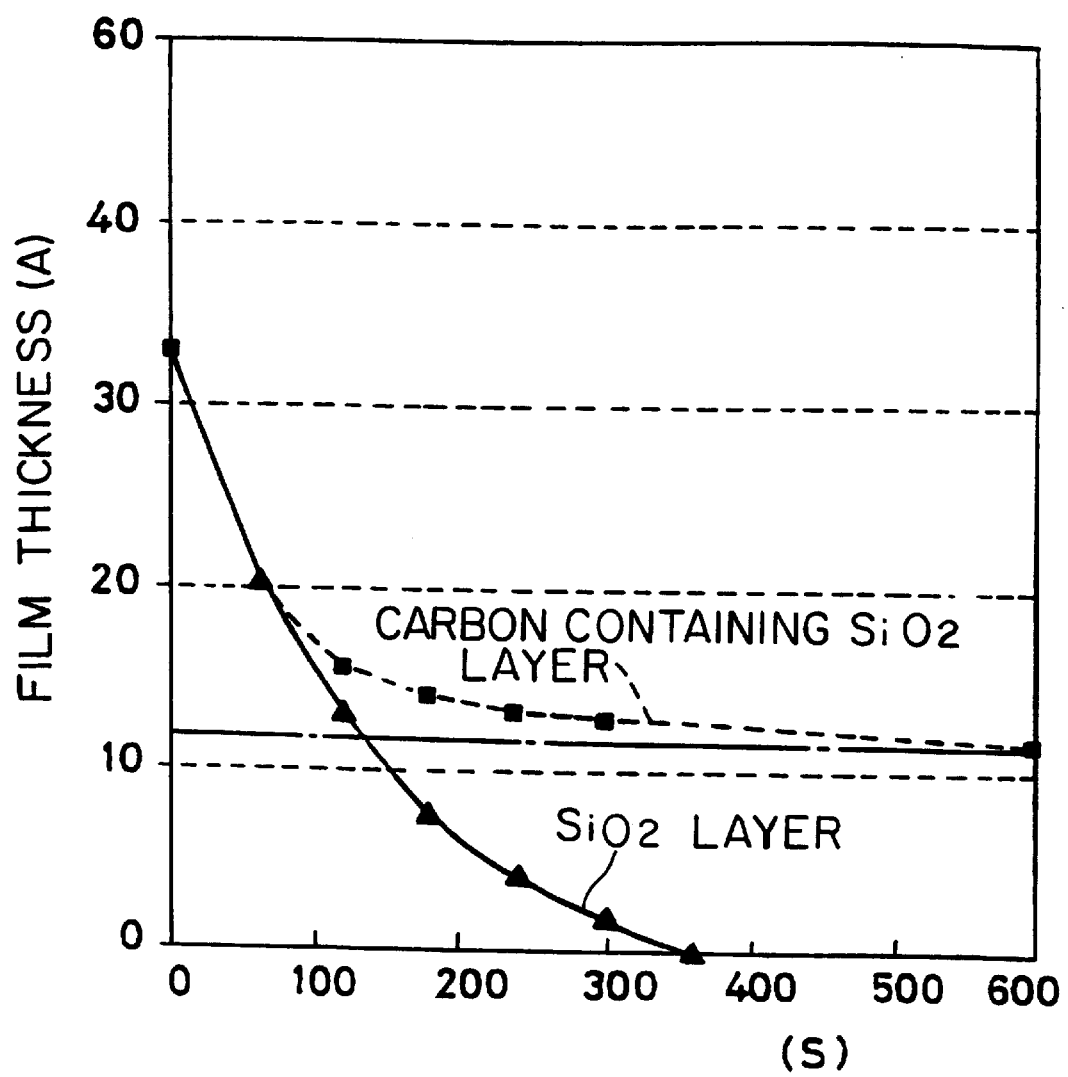
FIG. 13 is a diagram showing the dip time in DHF solution and residual oxide film thickness and the time of etching an oxide film thermally grown on pure silicon layer and an oxide film thermally grown on the carbon-containing silicon layer according to the present invention.

FIG. 13 shows the change in film thickness over time when two types of silicon dioxide layers, fabricated as described above, are dipped into an HF (DHF) solution of 200/1. The solid line shows the change in thickness of the silicon dioxide layer with no carbon content. As shown, a smooth etching is performed in the DHF solution, removing the silicon dioxide layer quickly. The dotted line shows the change in thickness of the carbon-containing silicon dioxide layer. The carbon content of the carbon-containing silicon layer before oxidation is 5 atom%. Etching in the DHF solution stops at a certain point. Based on the above, selective removal of only the silicon dioxide layers 411*a*, 411*b* can be achieved by dipping the silicon substrate 400 into the DHF solution for a certain period.

FIG. 12(*b*) shows a cross-sectional view of a device structure after the selective removal of silicon dioxide layers 411*a*, 411*b* by dipping the silicon substrate 400 in the DHF solution. Carbon-containing silicon dioxide layers 412*a*, 412*b* remains; vertical surfaces 413*a*, 413*b* of the silicon substrate 400 are exposed. The ability to obtain this structure by using conventional DHF without adding other process steps contributes to the simplification of the manufacturing process and the reduction of the manufacturing cost.

FIG. 12 (c) shows a cross-sectional view of a device structure in which an epitaxial layer is selectively grown horizontally on the silicon substrate surface using exposed vertical surfaces 413a, 413b. As seeds of the growth, silicon layers 414a, 414b are formed to constitute source/drain electrodes. The thicknesses of the source/drain electrodes 414a, 414b can be adjusted by adding another etching step such as RIE or chemical dry etching (CDE). Selective epitaxial growth can be performed by a well-known technique within the range of conventional effectiveness. For example, the silicon substrate 400 may be exposed to $SiH_2Cl_2$ and HCL at 800° C. in a high-vacuum environment. To promote horizontal growth, it is preferable that the vertical surfaces 413a, 413b have a desired crystal orientation (e.g., 100).

Even if there is variation in thickness or film quality of the silicon layers 414a, 414b which constitute the source/drain electrodes, the positions of junctions are defined by carbon-containing silicon dioxide layers 412a, 412b. Therefore, the fluctuation in threshold voltages is suppressed. Leakage current to the silicon substrate 400 is shielded by the carbon-containing silicon dioxide layers 412a, 412b, thus some crystalline defects in the silicon layers 414a, 414b are harmless to the device performance. In other words, the problems caused in conventional, selective, epitaxial growth, such as uneven film thickness and film quality, are overcome with the present invention. The source/drain electrodes are made conductive by incorporating appropriate dopants into the silicon layers 414a, 414b.

After the above step, the insulation layer 404 on top of the gate electrode 403 is etched off as required. A metal which reacts selectively with silicon (e.g., cobalt, tungsten, titanium layer; not illustrated) is deposited on the entire surface by a sputtering technique and the like. A thermal annealing, for example, a rapid thermal annealing (RTA) may be performed on the contact surface between the silicon and the metal layer, that is, on exposed silicon of the silicon layers 414a, 414b and the surface of the gate electrode 403 selectively to form silicide. At the same time, a dopant is diffused out from the silicon layer 414a, 414b to the channel region C of the semiconductor substrate 400.

Then, the residual metal which did not react is etched off by a solution, such as $HNO_3$, to self-align metal silicide layers 420a, 420b, 420c on the polysilicon gate layer 403, and on silicon layers 414a, 414b, forming the source/drain electrodes as shown in FIG. 11 (a). In this step, the device structure shown in FIG. 11(a) can be obtained.

Next, using well-known techniques, contacts are formed through contact holes to each of the electrodes; metal wirings are formed on the upper layer.

Because the carbon-containing isolation silicon layers 412a, 412b are inserted, when a contact (not illustrated) is formed for obtaining an electrical contact at a source/drain electrode(s), the metallic material of the contact does not diffuse below the junction.

A fourth preferred embodiment of the present invention relates to the fourth through sixth aspects of the present invention. The fourth embodiment relates to an Elevated Source/Drain MOSFET, which comprises an insulation layer below the source/drain electrodes and off-set regions between source/drain electrode(s) and the gate electrode.

Figure 14A:
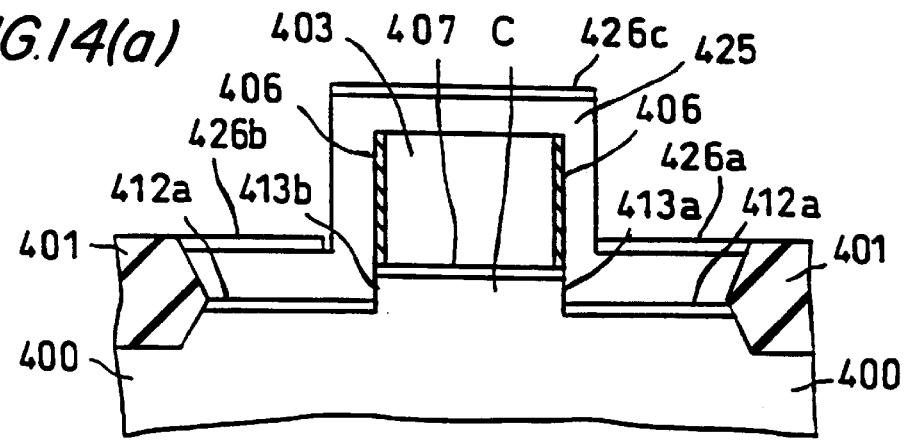
FIG. 14(a), 14(b) and 14(c) are cross-sectional views illustrating the manufacturing steps of forming an elevated source drain MOSFET having a carbon-containing silicon dioxide layer below the source/drain electrodes according to a fourth embodiment of the present invention.
Figure 14B:
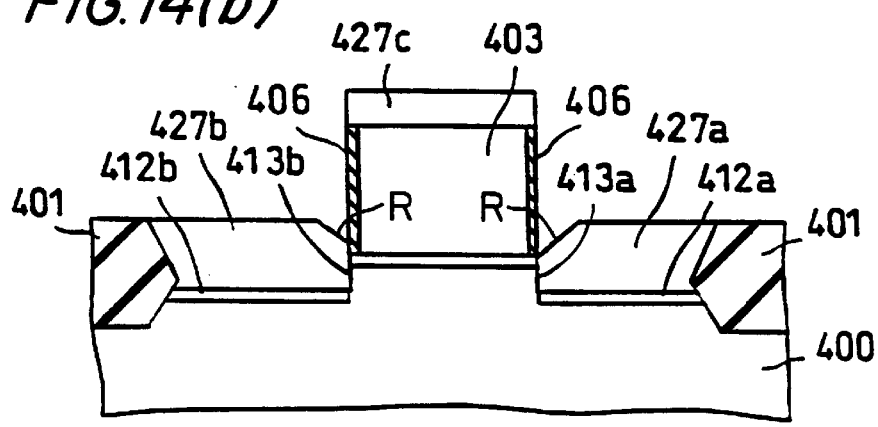
Figure 14C:
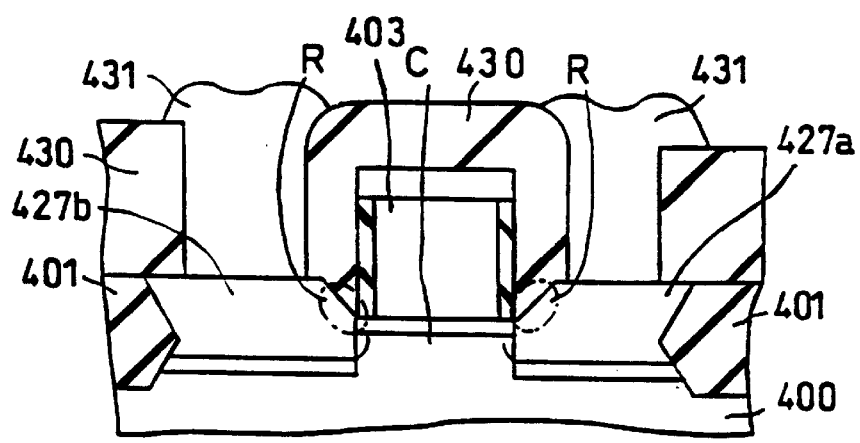
Figure 15:
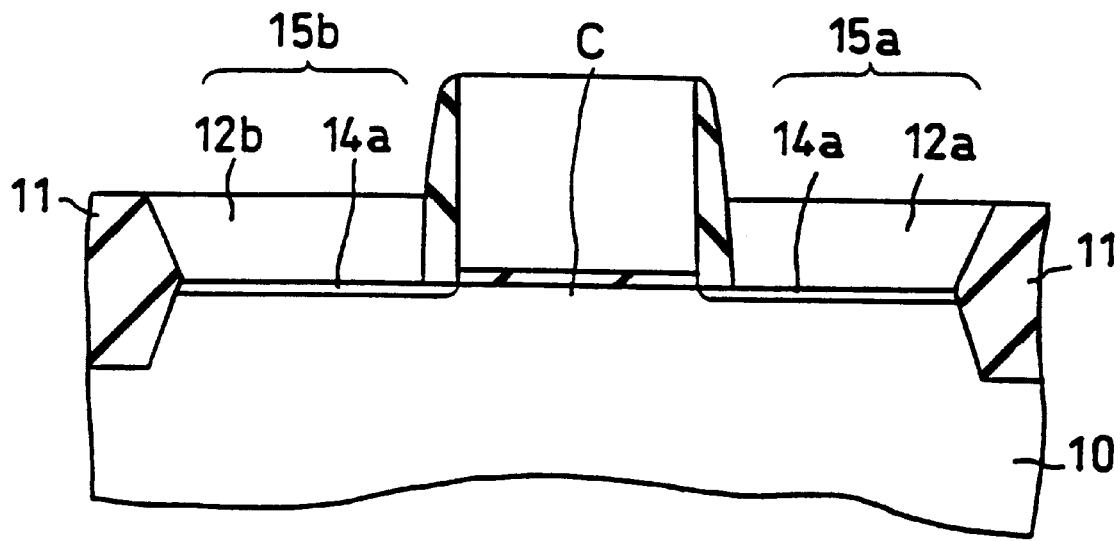
FIG. 15 is a cross-sectional view of a conventional elevated source drain type MOSFET.

FIGS. 14a, 14b, 14c show cross-sectional views showing the MOSFET according to the fourth embodiment of the present invention. In this section, configurations and effects which are different from the third embodiment are described herein. Like elements have like numbers to the elements of the third embodiment of the present invention.

Refer now to FIG. 14c, in the fourth embodiment of the present invention, source/drain electrodes 427a, 427b are adjacent to the channel region C and sets off from the gate electrode 403 at a predetermined distance. Hence, the source/drain electrodes 427a, 427b are provided with a taper portion R on their gate side edges and are given a structure suitable for reduction of parasitic capacitance between the gate electrode 403 and the source/drain electrodes 427a, 427b.

First, as described with reference to FIG. 11(b), FIG. 11(c), and FIG. 12(a) in the preferable mode of the third embodiment, the gate electrode 403 and the projected source/drain electrodes are formed. Then, as shown in FIG. 12(b), the exposed vertical surfaces 413a, 413b are formed at both sides below the gate electrode 403. As shown in FIG. 14(a), the insulation material 404 on top of the gate electrode 403 (see FIG. 12(b)) is etched off. Then, an amorphous silicon layer 425 is formed on the surface of a substrate 400, for example, by the CVD method. The amorphous silicon layer 425 can be formed by well-known technology. For example, it can be formed by introducing $SiH_4$ gas into a chamber at 0.2 torr at 400° C. Then, the amorphous silicon layer 425 is thermally processed for crystallization at a substrate temperature of 600° C. in a $N_2$ environment using the vertical surfaces 413a, 413b of the silicon substrate 400 as seeds. In addition, the semiconductor substrate 400 is exposed to the carbon-containing gas plasma to introduce carbon atoms exclusively on the horizontal surface of the semiconductor substrate 400. After that, the surface of silicon layer 425 is thermally oxidized and cleaned in the DHF solution to leave carbon-containing silicon dioxide layers 426a, 426b, 426c on the horizontal surfaces and exposed vertical surfaces of the silicon layer 425, as shown in FIG. 14(a).

Then, using these thin carbon-containing silicon dioxide layers 426a, 426b, 426c as protective layers, isotropic silicon etching is performed using, for example, CDE or KOH which has excellent selectivity against silicon dioxide layer, to selectively remove silicon layers on the vertical surfaces which are adjacent to the gate sidewall layer 406. An unwanted silicon layer on the isolation region 401 and carbon-containing, silicon dioxide layers 426a, 426b, 426c on the horizontal surface can be easily removed by the RIE technique and the like. As a result, as shown in FIG. 14(b), silicon layers 427a, 427b, which form the source/drain electrode(s) and the silicon layer 427c on the gate polysilicon layer 403 are formed. At this time, the silicon layer between the gate electrode 403 and the silicon layers 427a, 427b is eroded and the taper portion R is formed; this arrangement reduces the parasitic capacitance between these electrodes.

Then, a conductive dopant is introduced to the silicon layers 427a, 427b using the gate electrode 403 as a mask to form source/drain electrodes. A thermal processing is performed to activate the dopants with this heat treatment the dopants diffuse into 427a, 427b and partially into the end of the channel region under the gate electrode 403 through the vertical surfaces 413a, 413b (see FIG. 14(b)). However, the diffusion coefficient of a conductive dopant, such as P or B, in the carbon-containing silicon dioxide layers 412a, 412b (see FIG. 14(b)), is smaller than that in silicon itself by four digits or more. The diffusion of a dopant to the substrate 400 is impeded to a large extent by the carbon-containing silicon dioxide layers 412a, 412b. Thus, the position of the pn junction coincides with the position of the carbon-containing silicon layers 412a, 412b. Also, after forming the above source/drain electrodes, restrictions on allowable thermal processing and the like which can be made available are reduced.

After completing the above process steps, an insulation layer 430 of low dielectricity, such as fluorine added to the silicon dioxide layer, is formed on the semiconductor substrate 400 by an LPCVD method and the like. Contact holes which connect the source/drain electrode or the gate electrode to the interconnects on the upper layer are then formed. Metal materials 431 are formed in the contact holes to complete the field-effect transistor of this embodiment of the present invention.

The third and fourth embodiments of the present invention are described with reference to bulk silicon substrate and a silicon layer and the like which are used as a semiconductor substrate and as semiconductor layers which constitute source/drain electrodes. However, the present invention is not limited to these structures. Other substrates such as an SOI substrate and compound semiconductors, such as GaAs, InGaAs, and SiGe, may also be used. In addition, although a silicon dioxide layer was used for describing the carbon-containing insulation layer, another insulation layer, such as a nitride layer, an oxynitride layer, and the like, may be used.

The third and fourth embodiments of the present invention may provide: source/drain electrodes that are self-aligned with respect to the carbon-containing insulation layers; source/drain electrodes whose surface is located above the channel region; (this location is preferable in that it reduces the resistivity of the source/drain electrodes); and an offset region in the space between the source/drain electrode(s) and a gate electrode in which an insulation layer is formed. Formation of the isolation layer in the offset region is preferable to reduce parasitic capacitance.

As described, according to the present invention, insulation layers of different film thicknesses can be formed without additional steps, other than forming a carbon-containing semiconductor layer or adjusting the carbon content following the dopant concentration adjustment step. Also, according to the present invention, a semiconductor IC device which is suitable to the particular properties required in each of the regions can be provided.

Also according to the present invention, a junction may be formed with a uniform depth, and therefore a field-effect transistor devoid of threshold variations can be obtained. Also, a field-effect transistor can be obtained for which crystalline defects in the semiconductor layer of source/drain electrodes do not affect the device performance. The structure prevents a downward diffusion of conductive dopants. The junction position has a constant depth defined by the insulation layer even after the semiconductor manufacturing process, such as a thermal processing, which induces movement of the conductive dopant. Therefore, once the above structure is formed, the specifications and conditions required for thermal processing is less stringent. Further, a field-effect transistor with the least current leakage in the space between source/drain electrodes and a semiconductor substrate is produced.

In addition, according to the present invention, the sequential change in RIE conditions is a series of steps which can be performed substantially as a part of a single step, and yet which enables a carbon-containing insulation layer formation that can be placed accurately and selectively at a desired position below the source/drain electrodes.

What is claimed is:

1. A method for manufacturing a semiconductor integrated circuit device comprising:

forming a first carbon-containing semiconductor layer in a first region on a surface of a semiconductor substrate;

forming second carbon-containing semiconductor layer in a second region on said surface, the second semiconductor layer having less carbon content than said first carbon-containing semiconductor layer; and forming first and second gate-insulation layers in said first and second carbon-containing semiconductor layer, each gate-insulation layer having a film thickness dependent on the carbon contents in corresponding said carbon-containing semiconductor layer to form a semiconductor integrated circuit.

2. A method of manufacturing a semiconductor integrated circuit, as set forth in claim 1, further comprising forming a plurality of field-effect transistors having said gate-insulation layers.

3. A method of manufacturing a semiconductor integrated circuit device, as set forth in claim 1, wherein forming said first carbon-containing semiconductor layer includes using a pattern which was used to adjust dopant concentration in said first region.

4. A method of manufacturing a semiconductor integrated circuit device, as set forth in claim 1, wherein a plurality of said field-effect transistors in said first region constitutes a logic circuit, and a plurality of said field-effect transistors in said second region constitute a memory circuit, said circuits having different functions being monolithically formed on said surface.

5. A method of manufacturing a semiconductor integrated circuit device, as set forth in claim 1, wherein said steps of forming of said first and second carbon-containing semiconductor layers includes exposing said main surface to a carbon-containing plasma.

6. A method of manufacturing a semiconductor integrated circuit device comprising the following steps:

forming a plurality of carbon-containing semiconductor layers in a first region and in a second region on a surface of a semiconductor substrate;

altering the carbon content of said carbon-containing semiconductor layer in said second region to form a semiconductor layer of less carbon content in said second region than the carbon-containing semiconductor layer in said first region; and forming a plurality of gate-insulation layers having film thicknesses dependent on the carbon content of each of said carbon-containing semiconductor layers and said semiconductor layers.

7. A method of manufacturing a semiconductor integrated circuit device, as set forth in claim 6, wherein said carbon content altering step includes exposing the surface of said carbon-containing semiconductor layer to an HF solution.

8. A method of manufacturing a semiconductor device comprising:

forming a first semiconductor layer containing carbon on a surface of a semiconductor substrate;

forming on the surface of the semiconductor substrate a second semiconductor layer containing less carbon than the first semiconductor layer; and exposing said surface to a predetermined environment to convert said first and said second semiconductor layers into first and second insulation layers.

9. A method of manufacturing a semiconductor device, as set forth in claim 8, further comprising forming first and second circuits from respective first and second insulation layers; said insulation layers providing identical functions.

10. A method of manufacturing a semiconductor device, as set forth in claim 9, which includes selectively etching off said second insulation layer using an etching process in which he etch rate is dependent on carbon content.

11. A method of manufacturing a semiconductor device comprising:

forming a plurality of isolation regions on a surface of a semiconductor substrate;

forming a gate electrode on said surface in a device region surrounding by said plurality of isolation regions to form a channel region directly under said gate electrode;

forming a source/drain region having a bottom located lower than the channel region directly under said gate electrode;

forming a carbon-containing insulation layer at the bottom of said source/drain region;

forming an insulation layer having less carbon content than said carbon-containing insulation layer at the sides of said source/drain region;

selectively removing the insulation layer at said sides using the difference in etch rate between said carbon-containing insulation layer and said no-carbon insulation layer at the sides to form an exposed surface of said semiconductor substrate; and forming a source/drain electrode in said source/drain region.

12. A method of manufacturing a semiconductor device, as set forth in claim 11, wherein the step of forming said source/drain electrode includes a step of forming an epitaxial semiconductor layer on said exposed surface of said semiconductor substrate.

13. A method of manufacturing a semiconductor device, as set forth in claim 11, further comprising the steps of:

forming a semiconductor layer on said surface of said semiconductor substrate, and thereafter performing the following steps on parts of said surface of said semiconductor layer:

selectively forming a carbon-containing insulation layer on a part of the surface that is approximately parallel to the surface of said semiconductor substrate;

forming an insulation layer containing less carbon on a part of the surface that is approximately vertical to the surface of said substrate surface; and selectively removing said insulation layer containing less carbon and said semiconductor layer adjacent thereto.

* * * * *